(12) United States Patent
Oh et al.

(10) Patent No.: US 11,315,639 B2
(45) Date of Patent: Apr. 26, 2022

(54) MEMORY DEVICE HAVING VERTICAL STRUCTURE

(71) Applicant: SK hynix Inc., Icheon-si (KR)

(72) Inventors: Sung Lae Oh, Icheon-si (KR); Sang Woo Park, Icheon-si (KR); Dong Hyuk Chae, Icheon-si (KR); Ki Soo Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/087,096

(22) Filed: Nov. 2, 2020

(65) Prior Publication Data

US 2021/0383874 A1 Dec. 9, 2021

(30) Foreign Application Priority Data

Jun. 8, 2020 (KR) ........................ 10-2020-0068847

(51) Int. Cl.
| | |
|---|---|
| *G11C 16/24* | (2006.01) |
| *G11C 16/08* | (2006.01) |
| *H01L 27/11539* | (2017.01) |
| *H01L 27/11556* | (2017.01) |
| *H01L 27/11573* | (2017.01) |
| *H01L 27/11582* | (2017.01) |

(52) U.S. Cl.
CPC .............. *G11C 16/24* (2013.01); *G11C 16/08* (2013.01); *H01L 27/11539* (2013.01); *H01L 27/11556* (2013.01); *H01L 27/11573* (2013.01); *H01L 27/11582* (2013.01)

(58) Field of Classification Search
CPC ... G11C 16/24; G11C 16/08; H01L 27/11539; H01L 27/11556; H01L 27/11573; H01L 27/11582
See application file for complete search history.

(56) References Cited

U.S. PATENT DOCUMENTS

| | | | | |
|---|---|---|---|---|
| 10,115,667 | B2* | 10/2018 | Yun | H01L 27/0688 |
| 10,388,629 | B2* | 8/2019 | Kim | H01L 23/5226 |
| 10,748,886 | B2* | 8/2020 | Park | H01L 27/11582 |
| 2020/0105721 | A1* | 4/2020 | Park | H01L 25/50 |
| 2020/0365617 | A1* | 11/2020 | Ahn | H01L 27/11573 |
| 2020/0411108 | A1* | 12/2020 | Lee | G11C 16/08 |
| 2021/0066282 | A1* | 3/2021 | Kim | H01L 21/8221 |
| 2021/0343731 | A1* | 11/2021 | Chen | H01L 27/11507 |

FOREIGN PATENT DOCUMENTS

KR 1020210110995 A 9/2021

\* cited by examiner

*Primary Examiner* — Tri M Hoang

(57) ABSTRACT

A memory device includes a cell wafer including a memory cell array; a first logic wafer bonded to one surface of the cell wafer, and including a first logic circuit which controls the memory cell array; and a second logic wafer bonded to the other surface of the cell wafer which faces away from the one surface, and including a second logic circuit which controls the memory cell array.

27 Claims, 28 Drawing Sheets

MEMORY DEVICE HAVING VERTICAL STRUCTURE

CROSS-REFERENCE TO RELATED APPLICATION

The present application claims priority under 35 U.S.C. § 119(a) to Korean Patent Application No. 10-2020-0068847 filed in the Korean Intellectual Property Office on Jun. 8, 2020, which is incorporated herein by reference in its entirety.

BACKGROUND

1. Technical Field

Various embodiments generally relate to a semiconductor technology, and more particularly, to a memory device having a vertical structure.

2. Related Art

A memory device may include a memory cell array composed of memory cells that have different states depending on data stored therein. The memory cells may be accessed by word lines and bit lines, and the memory device may include circuits that are configured to access the memory cells by controlling the word lines and the bit lines. In addition, the memory device may include a circuit that is configured to perform an operation requested from the outside, such as data write, read and erase operations.

SUMMARY

Various embodiments are directed to measures capable of contributing to reducing the size of a memory device.

Various embodiments are directed to measures capable of contributing to improving the productivity of a memory device.

In an embodiment, a memory device may include: a cell wafer including a memory cell array; a first logic wafer bonded to one surface of the cell wafer, and including a first logic circuit that controls the memory cell array; and a second logic wafer bonded to the other surface of the cell wafer that faces away from the one surface, and including a second logic circuit that controls the memory cell array.

In an embodiment, a memory device may include: a cell wafer including a memory cell array; a first logic wafer bonded to a bottom of the cell wafer, and including a first logic circuit; and a second logic wafer bonded to a top of the cell wafer, and including a second logic circuit. The memory cell array may include: a source plate; and a stack structure including a plurality of electrode layers and a plurality of interlayer dielectric layers that are alternately stacked on the source plate.

DETAILED DESCRIPTION

Figure 1:
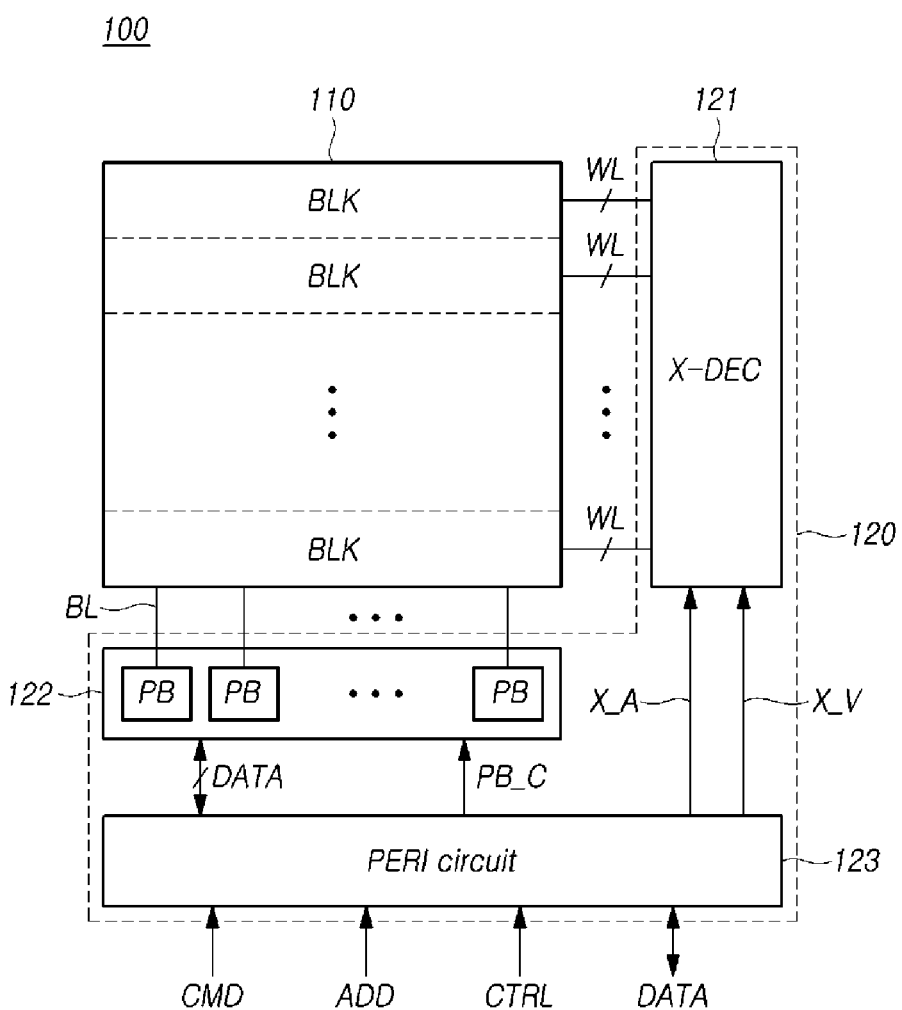
FIG. 1 is a block diagram schematically illustrating a representation of a memory device in accordance with an embodiment of the disclosure.

Advantages and features of the disclosure and methods to achieve them will become apparent from the descriptions of exemplary embodiments herein below and described with reference to the accompanying drawings. However, the present disclosure is not limited to the exemplary embodiments disclosed herein but may be implemented in various different ways. The exemplary embodiments of the present disclosure convey the scope of the disclosure to those skilled in the art.

Because the figures, dimensions, ratios, angles, numbers of elements given in the drawings that describe embodiments of the disclosure are merely illustrative, the present disclosure is not limited to the illustrated matters. Throughout the specification, like reference numerals refer to like components. In describing the disclosure, when it is determined that a detailed description of the related art may obscure the gist or clarity of the disclosure, the detailed description thereof will be omitted. It is to be understood that the terms "comprising," "having," "including" and so on, used in the description and claims, should not be interpreted as being restricted to the means listed thereafter unless specifically stated otherwise. Where an indefinite or definite article (e.g., "a," "an" or "the") is used when referring to a singular noun, the article may include a plural of that noun unless specifically stated otherwise.

In interpreting elements in embodiments of the disclosure, they should be interpreted as including error margins even in the absence of explicit statements.

Also, in describing the components of the disclosure, there may be used terms such as first, second, A, B, (a), and (b). These are solely for the purpose of differentiating one component from another component and do not limit the substances, order, sequence or number of the components. Also, components in embodiments of the disclosure are not limited by these terms. These terms are used to merely distinguish one component from another component.

Accordingly, as used herein, a first component may be a second component within the technical spirit of the disclosure.

If a component is described as "connected," "coupled" or "linked" to another component, it may mean that the component is not only directly "connected," "coupled" or "linked" but also is indirectly "connected," "coupled" or "linked" via a third component. In describing positional relationship, such as "an element A on an element B," "an element A above an element B," "an element A below an element B" and "an element A next to an element B," one or more other elements may be disposed between the elements A and B unless the term "directly" or "immediately" is explicitly used.

Features of various exemplary embodiments of the disclosure may be coupled, combined or separated partially or totally. Technically various interactions and operations are possible. Various exemplary embodiments can be practiced individually or in combination.

Hereinafter, various examples of embodiments of the disclosure will be described in detail with reference to the accompanying drawings.

FIG. 1 is a block diagram schematically illustrating a representation of a memory device in accordance with an embodiment of the disclosure.

Referring to FIG. 1, a memory device 100 in accordance with an embodiment of the disclosure may include a memory cell array 110 and a logic circuit 120. The logic circuit 120 may include a row decoder (X-DEC) 121, a page buffer circuit 122 and a peripheral circuit (PERI circuit) 123.

The memory cell array 110 may include a plurality of memory blocks BLK. Each of the plurality of memory blocks BLK may include a plurality of memory cells. The memory blocks BLK may be coupled to the row decoder 121 through a plurality of word lines WL. The memory cell array 110 may be coupled to the page buffer circuit 122 through a plurality of bit lines BL.

The row decoder 121 may select any one among the memory blocks BLK included in the memory cell array 110, in response to a row address X_A provided from the peripheral circuit 123. The row decoder 121 may transfer an operating voltage X_V, provided from the peripheral circuit 123, to word lines WL coupled to a memory block BLK that is selected from among the memory blocks BLK included in the memory cell array 110.

Although not illustrated, the row decoder (X-DEC) 121 may include a pass transistor circuit and a block switch circuit. The pass transistor circuit may include a plurality of pass transistor groups. The plurality of pass transistor groups may be coupled respectively to the plurality of memory blocks BLK. Each pass transistor group may be coupled to a corresponding memory block BLK through a plurality of word lines WL. The block switch circuit may select one of the pass transistor groups included in the pass transistor circuit, in response to the row address X_A received from the peripheral circuit 123. The block switch circuit may include a plurality of block switches, which are coupled to the pass transistor groups, respectively. As the row address X_A is received from the peripheral circuit 123, any one of the block is switches may be activated in response to the received row address X_A. The activated block switch may transfer a signal, provided from the peripheral circuit 123, to a corresponding pass transistor group. The pass transistor group selected by the block switch circuit (i.e., provided with the signal from the block switch circuit) may transfer the operating voltage X_V to word lines WL, which are coupled to a corresponding memory block BLK.

The page buffer circuit 122 may include a plurality of page buffers PB, which are coupled to the bit lines BL, respectively. The page buffers PB may receive a page buffer control signal PB_C from the peripheral circuit 123, and may transmit and receive a data signal DATA to and from the peripheral circuit 123. The page buffers PB may control the bit lines BL in response to the page buffer control signals PB_C. For example, the page buffers PB may detect data, stored in the memory cells of the memory cell array 110, by sensing the signals of the bit lines BL in response to the page buffer control signal PB_C, and may transmit the data signal DATA to the peripheral circuit 123 depending on the detected data. The page buffers PB may apply a signal to the bit lines BL, based on the data signal DATA received from the peripheral circuit 123, in response to the page buffer control signal PB_C, and thereby, may write data in the memory cells of the memory cell array 110. The page buffers PB may write data in or read data from memory cells that are coupled to an activated word line WL.

The peripheral circuit 123 may receive a command signal CMD, an address signal ADD and a control signal CTRL from a device outside the memory device 100, for example, a memory controller, and may transmit and receive data DATA to and from the device outside the memory device 100. The peripheral circuit 123 may output signals for writing data in the memory cell array 110 or reading data from the memory cell array 110, for example, the row address X_A, the page buffer control signal PB_C and so forth, based on the command signal CMD, the address signal ADD and the control signal CTRL. The peripheral circuit 123 may generate various voltages including the operating voltage X_V, which are required in the memory device 100.

As the degree of integration of the memory device 100 increases and the operating speed thereof increases, it is necessary to reduce a delay time caused by transferring an operating voltage from the row decoder 121 to the word lines WL. To this end, the row decoder 121 may be disposed to have a shape extending in a direction in which the word lines WL are arranged, and may have a length substantially the same as or similar to the memory cell array 110 in the direction in which the word lines WL are arranged.

As the degree of integration of the memory device 100 increases and the operating speed thereof increases, it is necessary to reduce a delay time of a signal applied to the bit lines BL by the page buffer circuit 122 or a signal provided to the page buffer circuit 122 through the bit lines BL. To this end, the page buffer circuit 122 may be disposed to have a shape extending in a direction in which the bit lines BL are arranged, and may have a length substantially the same as or similar to the memory cell array 110 in the direction in which the bit lines BL are arranged.

As the size of an electronic product in which the memory device 100 is mounted decreases, reduction in the size of the memory device 100 is continuously demanded. As the number of the word lines WL increases due to a demand for high capacity, the number of pass transistors of the row decoder 121 also increases. In consideration of these demands, pass transistors are disposed in a plurality of columns in an extending direction of the word lines WL. For the above reasons, as the width of the row decoder 121 in the extending direction of the word lines WL increases, the occupation area of the row decoder 121 also increases.

As the pitch of the bit lines BL decreases due to an increase in the degree of integration, the page buffers PB constituting the page buffer circuit 122 are disposed in a plurality of rows in an extending direction of the bit lines BL. Accordingly, as the length of the page buffer circuit 122 in the extending direction of the bit lines BL increases, the occupation area of the page buffer circuit 122 also increases.

As such, as the size of the memory device 100 decreases and the occupation areas of the row decoder 121 and the page buffer circuit 122 increase, a demand for an efficient layout utilization method is increasing. Embodiments of the disclosure include a layout utilization method appropriate for the size reduction, high capacity and high degree of integration of the memory device 100.

Hereinbelow, in the accompanying drawings, two directions that are parallel to the top surface of a substrate and intersect with each other are defined as a first direction FD and a second direction SD, respectively, and a direction that vertically protrudes from the top surface of the substrate is defined as a vertical direction VD. For example, the first direction FD may correspond to the extending direction of word lines, and the second direction SD may correspond to the extending direction of bit lines. The first direction FD and the second direction SD may substantially perpendicularly intersect with each other. The vertical direction VD may correspond to a direction that is perpendicular to the first direction FD and the second direction SD. In the drawings, a direction indicated by an arrow and a direction opposite thereto represent the same direction.

Although, the present specification describes the memory device 100 as a flash memory device as an example, the type of memory is not limited thereto, and the technical spirit of the disclosure may be applied to other types of memories in addition to flash memory. For example, a memory may be a DRAM, a PCRAM or a ReRAM. Although the present specification illustrates a case in which a row control circuit coupled to the word lines WL of the memory cell array 110 is a row decoder and a column control circuit coupled to the bit lines BL of the memory cell array 110 is a page buffer circuit, this represents a circuit configuration where a memory is a flash memory, and it should be understood that the row control circuit and the column control circuit may be changed depending on the type of a memory.

Figure 2:
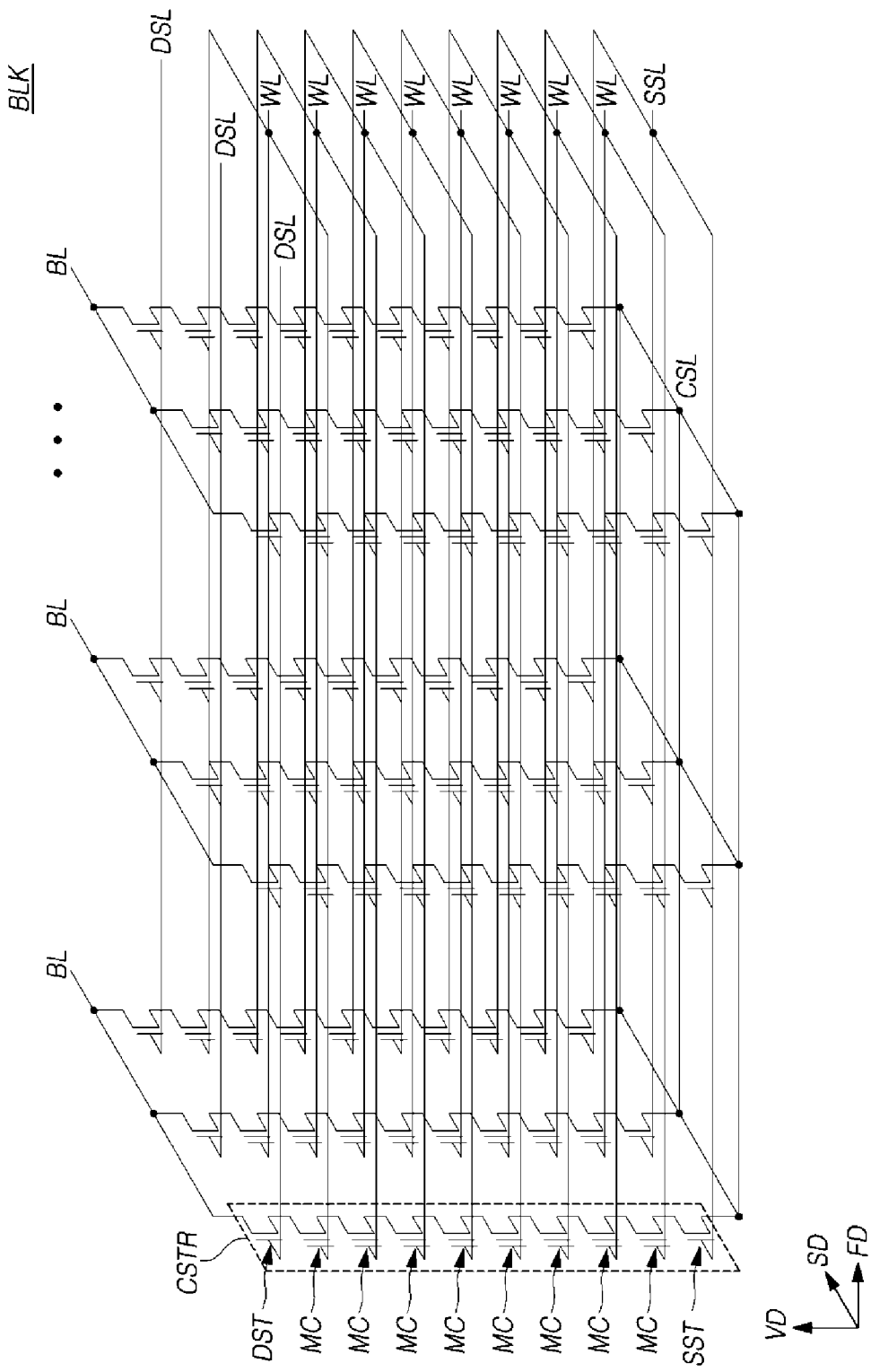
FIG. 2 is an equivalent circuit diagram illustrating a representation of an example of a memory block illustrated in FIG. 1.

FIG. 2 is an equivalent circuit diagram illustrating a representation of a memory block BLK illustrated in FIG. 1.

Referring to FIG. 2, the memory block BLK may include a plurality of cell strings CSTR corresponding to a plurality of bit lines BL and to a common source line CSL. The bit lines BL may extend in the second direction SD, and may be arranged in the first direction FD. A plurality of cell strings CSTR may be coupled in parallel to each of the bit lines BL. The cell strings CSTR may be coupled in common to the common source line CSL. The plurality of cell strings CSTR may be coupled between the plurality of bit lines BL and the one common source line CSL.

Each of the cell strings CSTR may include a drain select transistor DST, which is coupled to the bit line BL, a source select transistor SST, which is coupled to the common source line CSL, and a plurality of memory cells MC, which are coupled between the drain select transistor DST and the source select transistor SST. The drain select transistor DST, the memory cells MC and the source select transistor SST may be coupled in series in the vertical direction VD.

Drain select lines DSL, a plurality of word lines WL and a source select line SSL may be stacked between the bit lines BL and the common source line CSL in the vertical direction VD. Each of the drain select lines DSL may be coupled to the gates of corresponding drain select transistors DST. Each of the word lines WL may be coupled to the gates of corresponding memory cells MC. The source select line SSL may be coupled to the gates of source select transistors SST.

Memory cells MC that are coupled in common to one word line WL may configure one page.

Figure 3:
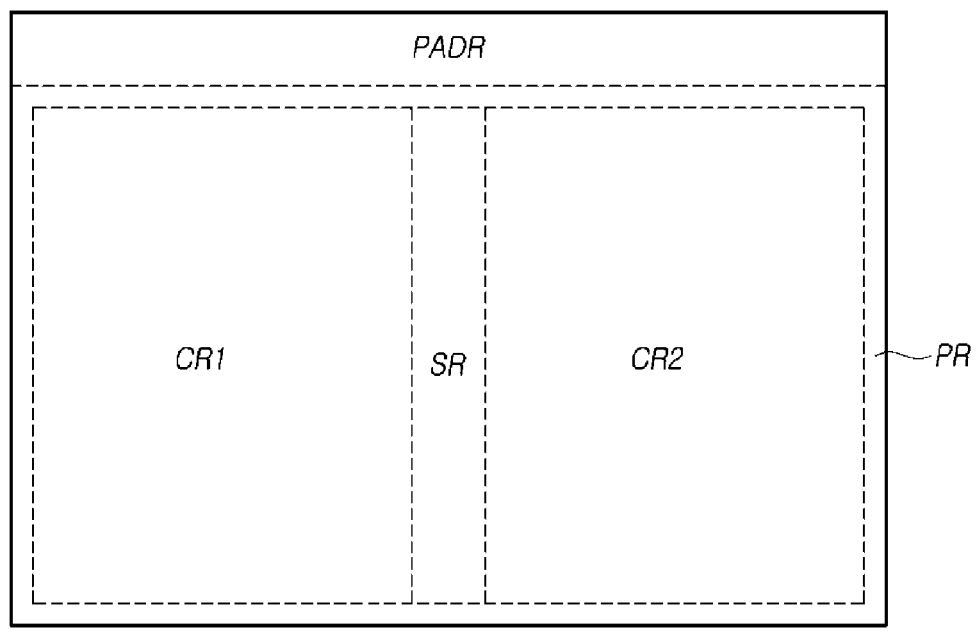
FIG. 3 is a top view illustrating a representation of an example of regions of a memory device in accordance with an embodiment of the disclosure.
Figure 3:
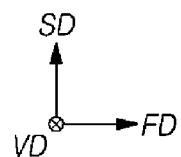

FIG. 3 is a top view illustrating a representation of an example of regions of a memory device in accordance with an embodiment of the disclosure.

Referring to FIG. 3, a memory device may be divided into a first cell region CR1, a second cell region CR2, a slimming region SR, a pad region PADR, and a peripheral region PR.

The pad region PADR may be disposed at an edge portion of the memory device in a shape extending the first direction FD. The slimming region SR may be disposed at the center portion of the memory device in a shape extending in the second direction SD. The first cell region CR1 and the second cell region CR2 may be disposed on opposite sides of the slimming region SR in the first direction FD, respectively. The peripheral region PR may be defined as a region remaining outside of the pad region PADR, the slimming region SR, the first cell region CR1 and the second cell region CR2. While the present embodiment illustrates a case where two cell regions CR1 and CR2 are included, the number of cell regions may be one or at least three or more.

Figure 4:
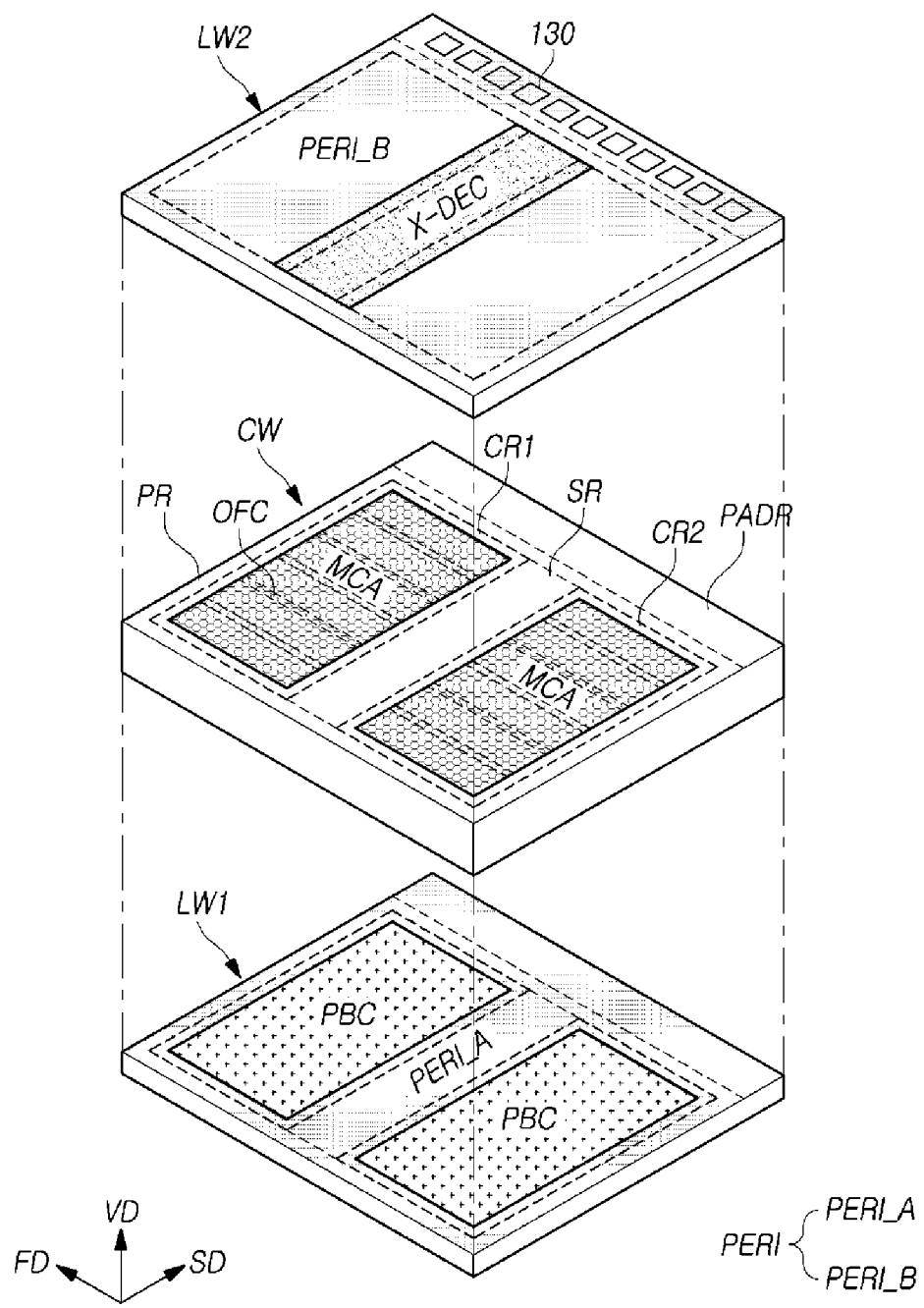
FIG. 4 is a diagram illustrating a representation of a schematic structure of a memory device in accordance with an embodiment of the disclosure.

FIG. 4 is a view schematically illustrating a representation of a schematic structure of a memory device in accordance with an embodiment of the disclosure.

Referring to FIG. 4, a memory device in accordance with an embodiment of the disclosure may include a first logic wafer LW1, a cell wafer CW that is bonded onto the first logic wafer LW1, and a second logic wafer LW2 that is bonded onto the cell wafer CW.

In order to facilitate understanding, FIG. 4 is an exploded view and illustrates that the first logic wafer LW1 and the cell wafer CW are separated from each other and that the cell wafer CW and the second logic wafer LW2 are separated from each other. However, it should be understood that the top surface of the first logic wafer LW1 and the bottom surface of the cell wafer CW are in contact with each other, and the top surface of the cell wafer CW and the bottom surface of the second logic wafer LW2 are in contact with each other.

The cell wafer CW may include a memory cell array MCA. The memory cell array MCA may configure the memory cell array 110 of FIG. 1. The memory cell array MCA may be disposed in a first cell region CR1 and a second cell region CR2. Although not illustrated, the memory cell array MCA may include a plurality of word lines that extend in the first direction FD, a plurality of bit lines that extend in the second direction SD, and a plurality of memory cells, which are coupled to the plurality of word lines and the plurality of bit lines.

Each of the first and second cell regions CR1 and CR2 may include a plurality of through wiring regions OFC. The through wiring region OFC may be a region including a wiring structure that electrically couples the bit lines of the memory cell array MCA and a page buffer circuit PBC. FIG. 4 illustrates each of the first and second cell regions CR1 and CR2 including a plurality of through wiring regions OFC, but the number of through wiring regions OFC included in each of the first and second cell regions CR1 and CR2 may be one.

A slimming region SR may be a region including a wiring structure that electrically couples the word lines of the memory cell array MCA and a row decoder X-DEC.

The first logic wafer LW1 may include the page buffer circuit PBC and a first peripheral circuit PERI_A. The page buffer circuit PBC may configure the page buffer circuit 122 of FIG. 1. The page buffer circuit PBC may be disposed in the first and second cell regions CR1 and CR2, and may overlap with the memory cell array MCA in the vertical direction VD. The first peripheral circuit PERI_A may be disposed in a region where the page buffer circuit PBC is not disposed in the first logic wafer LW1.

The second logic wafer LW2 may include the row decoder X-DEC and a second peripheral circuit PERI_B. The row decoder X-DEC may configure the row decoder 121 of FIG. 1. The second peripheral circuit PERI_B may configure the peripheral circuit 123 of FIG. 1 together with the first peripheral circuit PERI_A. For example, the first peripheral circuit PERI_A may include a first control circuit for controlling the page buffer circuit PBC, and the second peripheral circuit PERI_B may include a second control circuit for controlling the row decoder X-DEC.

The row decoder X-DEC may be disposed in the slimming region SR and edge portions of the first and second cell regions CR1 and CR2, which are adjacent to the slimming region SR, to have a shape extending in the second direction SD. A portion of the row decoder X-DEC may overlap with the memory cell array MCA in the vertical direction VD. For instance, the row decoder X-DEC may overlap with the memory cell array MCA in the vertical direction VD in the edge portions of the first and second cell regions CR1 and CR2, which are adjacent to the slimming region SR.

A portion of the row decoder X-DEC may overlap with the page buffer circuit PBC in the vertical direction VD. For instance, the row decoder X-DEC may overlap with the page buffer circuit PBC in the vertical direction VD in the edge portions of the first and second cell regions CR1 and CR2, which are adjacent to the slimming region SR.

The second peripheral circuit PERI_B may be disposed in a region where the row decoder X-DEC is not disposed in the second logic wafer LW2. A portion of the second peripheral circuit PERI_B may overlap with the memory cell array MCA in the vertical direction VD. A portion of the second peripheral circuit PERI_B may overlap with the page buffer circuit PBC in the vertical direction VD.

A plurality of external coupling pads 130 may be disposed in a pad region PADR and at the top surface of the second logic wafer LW2. The external coupling pads 130 may correspond to external contacts of the memory device and may be used for coupling to an external device, such as for example a memory controller. In the pad region PADR, the external coupling pads 130 may overlap with at least one of the first peripheral circuit PERI_A and the second peripheral circuit PERI_B in the vertical direction VD.

The present embodiment illustrates the first logic wafer LW1 including the page buffer circuit PBC and the first peripheral circuit PERI_A as bonded to the bottom of the cell wafer CW, and illustrates the second logic wafer LW2 including the row decoder X-DEC and the second peripheral circuit PERI_B as bonded to the top of the cell wafer CW, it is to be noted that the disclosure is not limited thereto. For example, the first logic wafer LW1 may be bonded to the top of the cell wafer CW, and the second logic wafer LW2 may be bonded to the bottom of the cell wafer CW.

Figure 5:
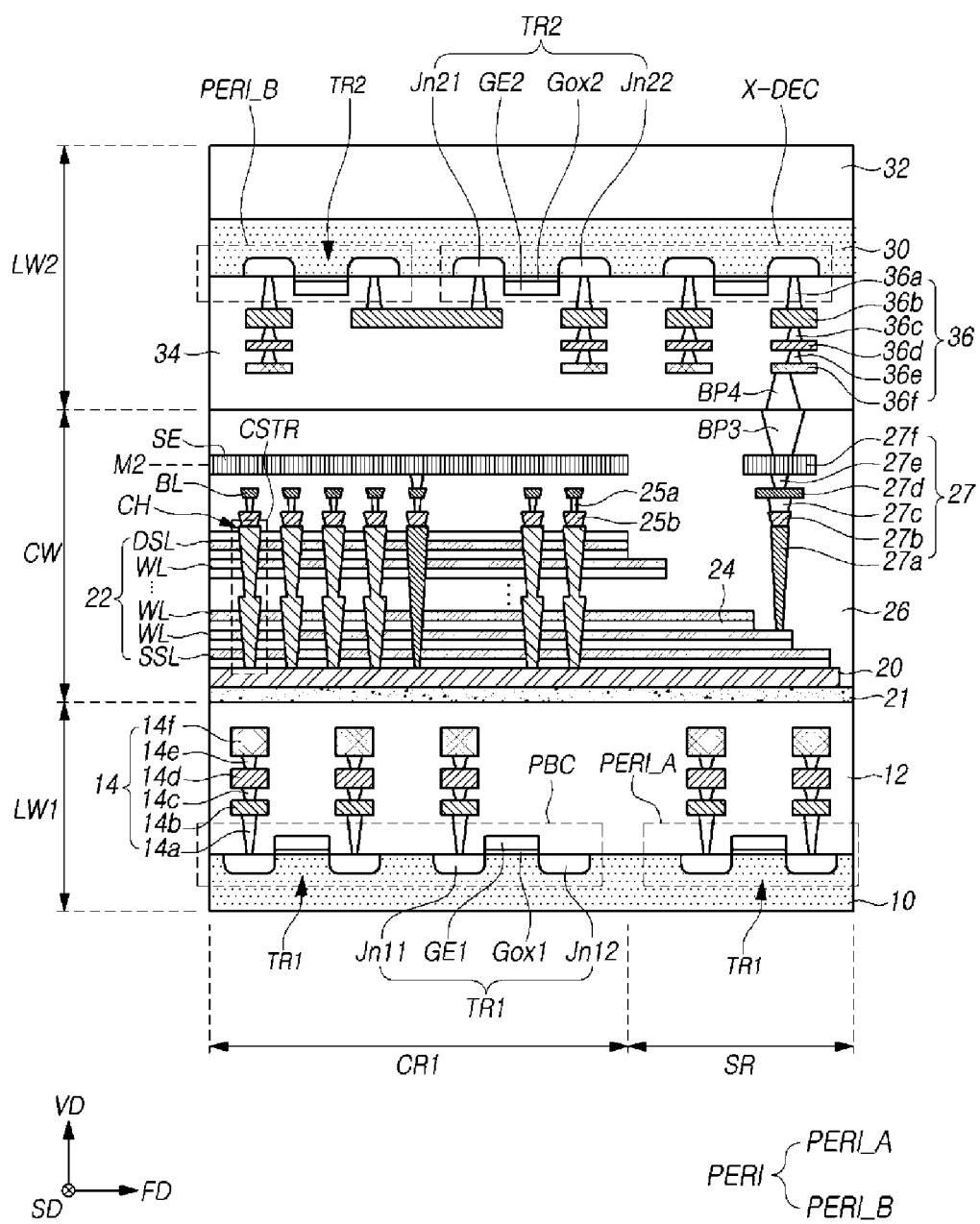
FIG. 5 is a cross-sectional view of the memory device of FIG. 4.
Figure 6:
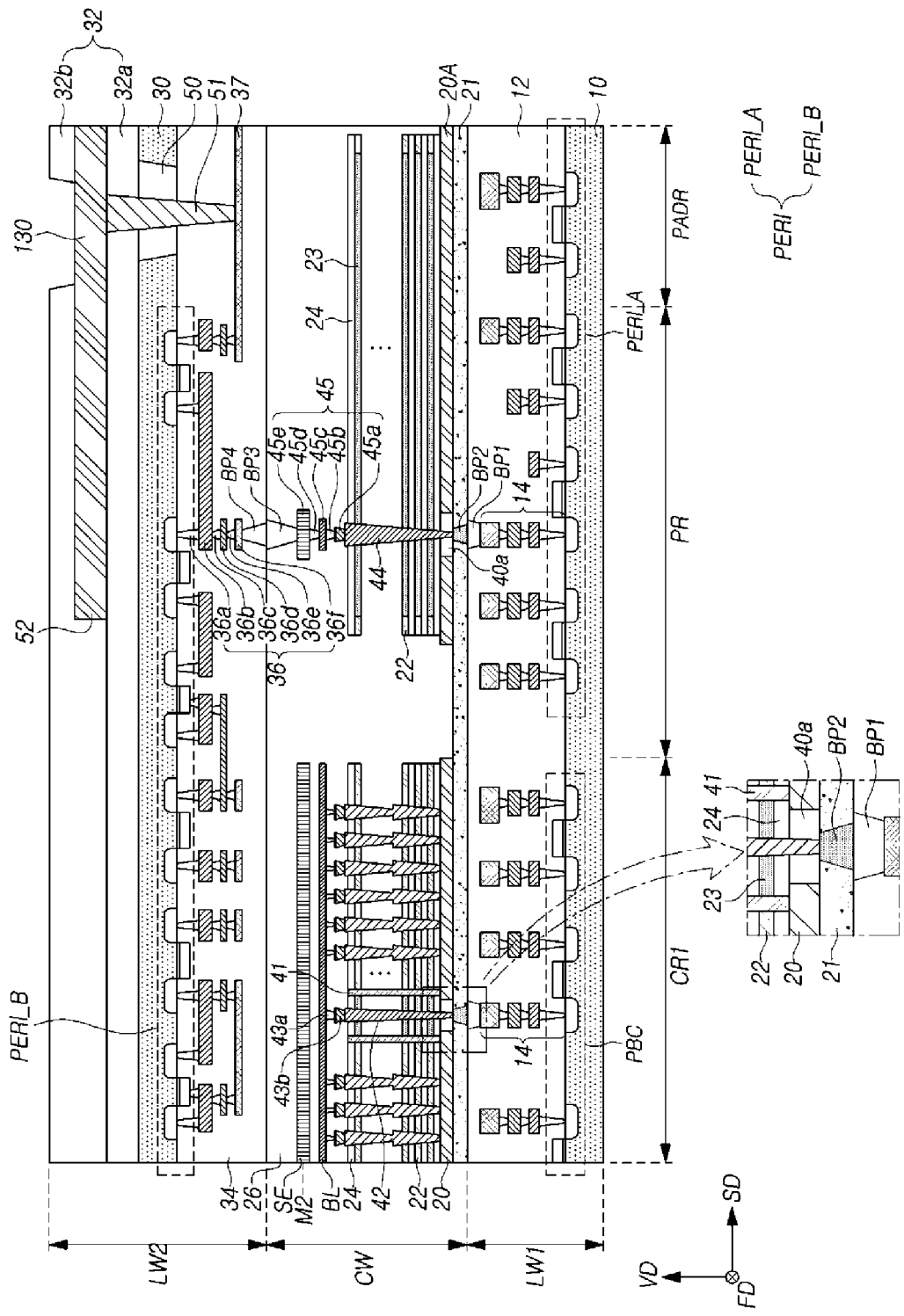
FIG. 6 is a cross-sectional view taken of the memory device of FIG. 4.

FIGS. 5 and 6 are cross-sectional views taken through a memory device of FIG. 4.

FIG. 5 illustrates a cross-section taken through the first cell region CR1 and the slimming region SR in the first direction FD, and FIG. 6 illustrates a cross-section taken through the first cell region CR1, a peripheral region PR and the pad region PADR in the second direction SD. In the following embodiments, only the structure of the first cell region CR1 is illustrated, and the structure of the second cell region CR2 is not illustrated. However, it should be understood that the second cell region CR2 also has substantially the same structure as the first cell region CR1.

Referring to FIG. 5, the first logic wafer LW1 may include a first substrate 10, and the page buffer circuit PBC and the first peripheral circuit PERI_A, which are defined on the first substrate 10.

The first substrate 10 may be a monocrystalline semiconductor film. For example, the first substrate 10 may be a bulk silicon substrate, a silicon-on-insulator substrate, a germanium substrate, a germanium-on-insulator substrate, a silicon-germanium substrate, or an epitaxial thin film formed through selective epitaxial growth.

The page buffer circuit PBC may be disposed in the first cell region CR1 of the first substrate 10, and the first peripheral circuit PERI_A may be disposed in a region where the page buffer circuit PBC is not disposed. Each of the page buffer circuit PBC and the first peripheral circuit PERI_A may include a plurality of first horizontal transistors TR1. The first horizontal transistor TR1 may include a gate dielectric layer Gox1 that is disposed on the first substrate 10, a gate electrode GE1 that is disposed on the gate dielectric layer Gox1, and junctions Jn11 and Jn12 that are defined in an active region of the first substrate 10 on both sides of the gate electrode GE1. The junctions Jn11 and Jn12 are regions that are defined by implanting an N-type or P-type impurity into the active region of the first substrate 10. One of the junctions, Jn11 or Jn12, may be used as a source region of the first horizontal transistor TR1, and the other may be used as a drain region of the first horizontal transistor TR1.

A dielectric layer 12 may be defined on the first substrate 10 to cover the page buffer circuit PBC and the first peripheral circuit PERI_A. The top surface of the dielectric layer 12 may constitute one surface of the first logic wafer LW1, which is bonded to the cell wafer CW. A contact structure 14a to 14f (collectively 14), which is coupled to each of the page buffer circuit PBC and the first peripheral circuit PERI_A, may be defined in the dielectric layer 12. The contact structure 14 may include a plurality of wiring lines 14b, 14d and 14f which are disposed at different height levels, and a plurality of contacts 14a, 14c and 14e, which couple at least one of the page buffer circuit PBC and the first peripheral circuit PERI_A and the plurality of wiring lines 14b, 14d and 14f.

The cell wafer CW may include a source plate 20 that is defined in the first cell region CR1 and the slimming region SR, and a stack structure that is defined on the source plate 20. The stack structure may include a plurality of electrode layers 22 and a plurality of interlayer dielectric layers 24, which are alternately stacked on the source plate 20.

The source plate 20 may include a semiconductor material, for example, a group IV semiconductor, a group III-V compound semiconductor or a group II-VI compound semiconductor. For example, the group IV semiconductor may include silicon, germanium or silicon-germanium. For example, the source plate 20 may be provided as a polycrystalline layer or an epitaxial layer.

The electrode layers 22 may include a conductive material. For example, the electrode layers 22 may include at least one selected among a doped semiconductor (e.g., doped silicon), a metal (e.g., tungsten, copper or aluminum), a conductive metal nitride (e.g., titanium nitride or tantalum nitride) and a transition metal (e.g., titanium or tantalum). Among the electrode layers 22, at least one electrode layer 22 from the lowermost electrode layer 22 may configure a source select line SSL. Among the electrode layers 22, at least one electrode layer 22 from the uppermost electrode layer 22 may configure a drain select line DSL. The electrode layers 22 between the source select line SSL and the drain select line DSL may configure word lines WL. The interlayer dielectric layers 24 may include silicon oxide.

Although not illustrated, a plurality of first slits that divide the stack structure into memory block units may be defined. A second slit that divides the drain select line DSL and the source select line SSL into units each smaller than the memory block, for example, sub-block units, may be defined between adjacent first slits. Accordingly, the word lines WL may be divided into memory block units, and the drain select line DSL and the source select line SSL may be divided in sub-block units.

The electrode layers 22 may extend from the first cell region CR1 to the slimming region SR in different lengths, thereby forming stairway-shaped steps in the slimming region SR. In the slimming region SR, the electrode layers 22 may be disposed to form the steps in the first direction FD as illustrated in FIG. 5. Although not illustrated, in the slimming region SR, the electrode layers 22 may be disposed to form steps even in the second direction SD.

In the stairway-shaped steps, as an underlying electrode layer 22 extends longer than an overlying electrode layer 22 into the slimming region SR, a contact pad region with an exposed upper surface may be defined in each of the electrode layers 22. A contact 27a of a contact structure 27a to 27f (collectively 27) may be coupled to the contact pad region of the electrode layer 22.

A plurality of vertical channels CH that pass through the plurality of electrode layers 22 and the plurality of interlayer dielectric layers 24 in the vertical direction VD may be defined in the first cell region CR1. While not illustrated in detail, each of the vertical channels CH may include a channel layer and a gate dielectric layer. The channel layer may include polysilicon or monocrystalline silicon, and may include, in some regions thereof, a P-type impurity such as boron (B). The gate dielectric layer may have a shape which surrounds the outer wall of the channel layer. The gate dielectric layer may include a tunnel dielectric layer, a charge storage layer and a blocking layer which are sequentially stacked from the outer wall of the channel layer. In some embodiments, the gate dielectric layer may have an ONO (oxide-nitride-oxide) stack structure in which an oxide layer, a nitride layer and an oxide layer are sequentially stacked.

Source select transistors may be configured in areas or regions where the source select line SSL surrounds the vertical channels CH. Memory cells may be configured in areas or regions where the word lines WL surround the vertical channels CH. Drain select transistors may be configured in areas or regions where the drain select line DSL surrounds the vertical channels CH. The source select transistor, the plurality of memory cells and the drain select transistor disposed along one vertical channel CH may configure one cell string CSTR.

A plurality of bit lines BL may be disposed over a stack structure, which includes the plurality of electrode layers 22 and the plurality of interlayer dielectric layers 24 that are alternately stacked. The bit lines BL may extend in the second direction SD, and may be arranged in the first direction FD. The bit line BL may be coupled to the vertical channel CH through a contact structure 25a and 25b defined thereunder.

The cell wafer CW may further include a base dielectric layer 21 that is defined on the bottom surface of the source plate 20. The bottom surface of the base dielectric layer 21 may be bonded to the first logic wafer LW1. The bottom surface of the base dielectric layer 21 may constitute one surface of the cell wafer CW, which is bonded to the first logic wafer LW1. The base dielectric layer 21 may be formed of the same material as the dielectric layer 12 of the first logic wafer LW1, for example, an oxide.

A dielectric layer 26 may be defined on the base dielectric layer 21 to cover the source plate 20, the stack structure and the bit lines BL. The top surface of the dielectric layer 26 may constitute the other surface of the cell wafer CW, which is bonded to the second logic wafer LW2.

The second logic wafer LW2 may include a second substrate 30, and the row decoder X-DEC and the second peripheral circuit PERI_B, which are defined on the bottom surface of the second substrate 30.

The second substrate 30 may have the bottom surface that extends in the first direction FD and the second direction SD. For example, the second substrate 30 may be a bulk silicon substrate, a silicon-on-insulator (SOI) substrate, a germanium substrate, a germanium-on-insulator (GOI) substrate, a silicon-germanium substrate, or an epitaxial thin film formed through selective epitaxial growth.

The row decoder X-DEC may be disposed in the slimming region SR and an edge portion of the first cell region CR1 that is adjacent to the slimming region SR. The second peripheral circuit PERI_B may be disposed in a region where the row decoder X-DEC is not disposed.

Each of the row decoder X-DEC and the second peripheral circuit PERI_B may include a plurality of second horizontal transistors TR2. The second horizontal transistor TR2 may include a gate dielectric layer Gox2 that is disposed on the bottom surface of the second substrate 30, a gate electrode GE2 that is disposed under the gate dielectric layer Gox2, and junctions Jn21 and Jn22 that are disposed in an active region of the second substrate 30 on both sides of the gate electrode GE2. The junctions Jn21 and Jn22 are regions that are defined by implanting an N-type or P-type impurity into the active region of the second substrate 30. One of the junctions, Jn21 or Jn22, may be used as a source region of the second horizontal transistor TR2, and the other may be used as a drain region of the second horizontal transistor TR2.

A dielectric layer 32 may be defined on the top surface of the second substrate 30 to cover the top surface of the second substrate 30. A dielectric layer 34 may be defined on the bottom surface of the second substrate 30 to cover the row decoder X-DEC and the second peripheral circuit PERI_B. The bottom surface of the dielectric layer 34 may constitute one surface of the second logic wafer LW2, which is bonded to the cell wafer CW.

The row decoder X-DEC may include thin-film transistors, low-voltage transistors and high-voltage transistors. The page buffer circuit PBC may include low-voltage transistors and high-voltage transistors, and may not include thin-film transistors. A peripheral circuit PERI may include thin-film transistors, low-voltage transistors and high-voltage transistors. The thin-film transistors of the peripheral circuit PERI may be included in the second peripheral circuit PERI_B, and may not be included in the first peripheral circuit PERI_A.

The first horizontal transistors TR1 of the first logic wafer LW1 may include only low-voltage transistors and high-voltage transistors, and may not include thin-film transistors. The second horizontal transistors TR2 of the second logic wafer LW2 may include thin-film transistors, low-voltage transistors and high-voltage transistors.

The thickness of a gate dielectric layer is greatest in high-voltage transistors, thinner in low-voltage transistors and thinnest in thin-film transistors. Accordingly, the thickness of the thinnest gate dielectric layer among the gate dielectric layers Gox1 in the first logic wafer LW1, which does not include thin-film transistors, may be greater than the thickness of the thinnest gate dielectric layer among the gate dielectric layers Gox2 in the second logic wafer LW2, which may include thin-film transistors. The number of different thicknesses of the gate dielectric layers Gox1 defined in the first logic wafer LW1 may be less than the number of different thicknesses of the gate dielectric layers Gox2 defined in the second logic wafer LW2.

As a method for forming gate dielectric layers having different thicknesses on a single wafer, a method may be used in which a thick gate dielectric layer is formed on a substrate, then the thick gate dielectric layer that is defined in a thin gate dielectric layer forming region is removed, and then a gate dielectric layer having a thin thickness is additionally formed. In order to remove the thick gate dielectric layer defined in the thin gate dielectric layer forming region, a mask pattern forming process of forming a mask pattern exposing the thin gate dielectric layer forming region, an etching process of removing the thick gate dielectric layer exposed by the mask pattern, and a stripping process of removing the mask pattern remaining after the etching may be required. Thus, the larger the number of different thicknesses of gate dielectric layers to be formed in a single wafer, the greater the required number of manufacturing steps for forming the gate dielectric layers. As is well known in the art, if the number of manufacturing steps increases, manufacturing time and manufacturing cost may increase.

By disposing the page buffer circuit PBC and the first peripheral circuit PERI_A, including low-voltage transistors and high-voltage transistors but not including thin-film transistors, in the first logic wafer LW1, the memory device in accordance with the present embodiment may simplify a manufacturing process by reducing the number of manufacturing steps required for forming the gate dielectric layers of the first logic wafer LW1, thereby contributing to reducing manufacturing time and manufacturing cost.

As the bit lines BL are formed, with a high degree of integration, to have a fine pitch, wiring lines that couple the bit lines BL and the page buffer circuit PBC are also formed to have a fine pitch. If the pitch of wiring lines becomes fine, then the margin of a wiring line forming process becomes tight, so that the difficulty of the process may increase and the probability of the occurrence of a failure during the process may increase. In order to reduce the cost required for manufacturing the memory device, it is necessary to reduce the manufacturing cost of the first logic wafer LW1 including the page buffer circuit PBC, which has a high probability of failure.

By configuring the row decoder X-DEC and the second peripheral circuit PERI_B in a wafer separate from the page buffer circuit PBC, and thereby reducing the number of logic circuits disposed in the same wafer as the page buffer circuit PBC, embodiments of the disclosure may contribute to reducing the manufacturing cost of the first logic wafer LW1 including the page buffer circuit PBC. Moreover, by disposing only high-voltage transistors and low-voltage transistors and not disposing thin-film transistors in the first logic wafer LW1, including the page buffer circuit PBC, and thereby reducing the number of different thicknesses of the gate dielectric layers Gox1 configured in the first logic wafer LW1, embodiments of the disclosure may further contribute to reducing the manufacturing cost of the first logic wafer LW1 including the page buffer circuit PBC.

Referring to FIG. 6, the source plate 20 and a dummy source plate 20A may be disposed on the base dielectric layer 21 of the cell wafer CW. The source plate 20 may be disposed in the first cell region CR1 and the slimming region SR (see FIG. 5), and the dummy source plate 20A may be disposed in a region where the source plate 20 is not disposed. The dummy source plate 20A may be formed at the same process step and of the same material as the source plate 20. The stack structure may be disposed on the source plate 20, and a dummy stack structure may be disposed on the dummy source plate 20A.

An etch barrier 41 that passes through the stack structure may be defined in the first cell region CR1. The etch barrier 41 may be provided in a shape that surrounds a portion of the stack structure in the first cell regions CR1. A region where the stack structure surrounded by the etch barrier 41 is positioned may correspond to the through wiring region OFC defined in FIG. 4. The stack structure may have different structures due to the presence of the etch barrier 41. In detail, the stack structure that is surrounded by the etch barrier 41 may have a structure (hereinafter, referred to as a 'dielectric stack of the stack structure') in which a plurality of dielectric layers 23 and the plurality of interlayer dielectric layers 24 are alternately stacked, and the stack structure outside the etch barrier 41 may have a structure (hereinafter, referred to as an 'electrode stack') in which the plurality of electrode layers 22 and the plurality of interlayer dielectric layers 24 are alternately stacked. The dielectric stack of the stack structure may overlap with the page buffer circuit PBC in the vertical direction VD in the first cell region CR1.

The electrode layers 22 may be formed by replacing the dielectric layers 23, after the plurality of dielectric layers 23 and the plurality of interlayer dielectric layers 24 are alternately stacked. The dielectric layers 23 serving as sacrificial layers may be formed of a dielectric material that has an etching selectivity with respect to the interlayer dielectric layers 24. For example, the interlayer dielectric layers 24 may be silicon oxide, and the dielectric layers 23 may be silicon nitride. A process of replacing the dielectric layers 23 with the electrode layers 22 may be performed in a way that removes the dielectric layers 23 and fills an electrode material in spaces from which the dielectric layers 23 are removed. The etch barrier 41 may serve to block an etchant, used in the removal of the dielectric layers 23, from entering the through wiring region OFC in the process of removing the dielectric layers 23. The etch barrier 41 may be formed of a dielectric material that has an etching selectivity with respect to the dielectric layers 23. For example, in the case where the dielectric layers 23 are silicon nitride, the etch barrier 41 may be silicon oxide.

When forming the stack structure, the dummy stack structure may be formed together with the stack structure. In the process of removing the dielectric layers 23, as the etchant used in the removal of the dielectric layers 23 penetrates through the side surfaces of the dummy stack structure, the dielectric layers 23 may be removed at the peripheral portions of the dummy stack structure close to the side surfaces, and may not be removed and remain at the inside of the dummy stack structure distant from the side surfaces. Accordingly, the dielectric layers 23 may be replaced with the electrode layers 22 at the peripheral portions of the dummy stack structure close to the side surfaces, and may not be replaced with the electrode layers 22 at the inside of the dummy stack structure distant from the side surfaces. Therefore, the peripheral portions of the dummy stack structure may have a structure in which the electrode layers 22 and the interlayer dielectric layers 24 are alternately stacked, and the inside of the dummy stack structure surrounded by the peripheral portions may have a structure (hereinafter, referred to as a 'dielectric stack of the dummy stack structure') in which the dielectric layers 23 and the interlayer dielectric layers 24 are alternately stacked.

An isolation dielectric layer 40a, which passes through the source plate 20 and the dummy source plate 20A, may be defined. The first logic wafer LW1 may include a plurality of bonding pads BP1 on the one surface thereof that is bonded to the cell wafer CW. Each of the bonding pads BP1 may be coupled to one of the page buffer circuit PBC and the first peripheral circuit PERI_A through the contact structure 14, which is defined in the dielectric layer 12.

The cell wafer CW may include a plurality of bonding pads BP2 that are bonded to the plurality of bonding pads BP1, on the one surface thereof that is bonded to the first logic wafer LW1. The bonding pads BP2 may be formed by forming holes that pass through the base dielectric layer 21 from the bottom surface of the base dielectric layer 21 and filling the holes with a conductive material. Each hole may have a side slope due to an etch loading during an etching process for forming the hole. Due to such a characteristic in process, the width of each bonding pad BP2 may gradually narrow from the bottom to the top.

A contact 42 that passes through the dielectric stack of the stack structure and the isolation dielectric layer 40a and is coupled to one of the bonding pads BP2 may be defined. The bit line BL may be disposed over the stack structure, and may be coupled to the contact 42 through a contact structure 43a and 43b. The contact structure 43a and 43b, the contact 42, the bonding pads BP1 and BP2 and the contact structure 14 may configure a wiring structure that couples the bit line BL and the page buffer circuit PBC. A contact 44 that passes through the dielectric stack of the dummy stack structure and the isolation dielectric layer 40a and is coupled to another one of the bonding pads BP2 may be defined.

Referring to FIGS. 5 and 6 again, the cell wafer CW may include a plurality of bonding pads BP3 on the other surface thereof, which is bonded to the second logic wafer LW2. The bonding pads BP3 may be exposed on the top surface of the dielectric layer 26. One of the bonding pads BP3 may be coupled to the electrode layer 22 through a contact structure 27a to 27f (collectively 27), which is defined in the dielectric layer 26. Another one of the bonding pads BP3 may be coupled to the contact 44 through a contact structure 45a to 45e (collectively 45) which is defined in the dielectric layer 26.

Although FIG. 5 illustrates, for the sake of simplicity in illustration, only one contact structure 27 and only one bonding pad BP3, which are coupled to one electrode layer 22, it should be understood that a plurality of contact structures 27 and a plurality of bonding pads BP3, which are coupled to the plurality of electrode layers 22, are provided.

Although FIG. 6 illustrates, for the sake of simplicity in illustration, only one contact 42 that passes through the dielectric stack of the stack structure, it should be understood that a plurality of contacts 42, which are coupled to the plurality of bit lines BL, are provided. Although FIG. 6 illustrates, for the sake of simplicity in illustration, only one contact 44 that passes through the dummy stack structure, it should be understood that a plurality of contacts 44, which pass through the dummy stack structure, are provided.

The second logic wafer LW2 may include a plurality of bonding pads BP4 that are bonded to the bonding pads BP3 of the cell wafer CW, on the one surface thereof, which is bonded to the cell wafer CW. The bonding pad BP4 may be coupled to one of the row decoder X-DEC and the second peripheral circuit PERI_B through a contact structure 36a to 36f (collectively 36), which is defined in the dielectric layer 34.

An isolation dielectric layer 50, which passes through the second substrate 30, may be defined in the second substrate 30. The isolation dielectric layer 50 serves to isolate a plug 51, which will be described hereunder, from the second substrate 30, and may be disposed in a region where the row decoder X-DEC and the second peripheral circuit PERI_B are not disposed.

The top surfaces of the second substrate 30 and the isolation dielectric layer 50 may be covered with a dielectric layer 32a. The plug 51, which is coupled to a wiring line 37 in the dielectric layer 34 by passing through the dielectric layer 32a and the isolation dielectric layer 50 from the top surface of the dielectric layer 32a, may be defined. The wiring line 37 may be electrically coupled to the second peripheral circuit PERI_B.

Although the present embodiment illustrates the isolation dielectric layer 50 and the plug 51 disposed in the pad region PADR, the disclosure is not limited thereto. The isolation dielectric layer 50 and the plug 51 may be disposed in a region where the row decoder X-DEC and the second peripheral circuit PERI_B are not disposed in the second substrate 30.

A wiring line 52 may be defined on the dielectric layer 32a and be coupled to the plug 51. A dielectric layer 32b may be defined on the dielectric layer 32a. The dielectric layer 32b may have an opening that exposes a portion of the wiring line 52 in the pad region PADR. The portion of the wiring line 52 that is exposed by the opening may configure an external coupling pad 130.

According to the embodiment described above with reference to FIGS. 4 to 6, because the first logic wafer LW1, in which the page buffer circuit PBC is defined, is bonded to the bottom of the cell wafer CW, and because the second logic wafer LW2, in which the row decoder X-DEC is defined, is bonded to the top of the cell wafer CW, bonding pads used for coupling between the bit lines BL of the memory cell array MCA and the page buffer circuit PBC, and bonding pads used for coupling between the word lines WL (the electrode layers 22) of the memory cell array MCA and the row decoder X-DEC, may be disposed on different planes. Accordingly, because the number of bonding pads disposed in a single plane is small, and it is possible to form the bonding pads in a larger size, and a pad alignment margin when bonding wafers may be increased, thereby contributing to suppression or reduction in the occurrence of a coupling failure between the bonding pads.

As the stack number of the electrode layers 22 increases in order to improve memory capacity, the time required for fabricating a memory cell array is increasing. According to embodiments of the disclosure, a memory cell array is fabricated on a separate wafer from a column control circuit and a row control circuit wafer. Therefore, when compared to a case in which a memory cell array is fabricated on the same wafer as a column control circuit and/or a row control circuit, it is possible to reduce the number of manufacturing process steps and to shorten the time required for fabricating the wafer including the memory cell array, thereby contributing to improving productivity.

Figure 7:
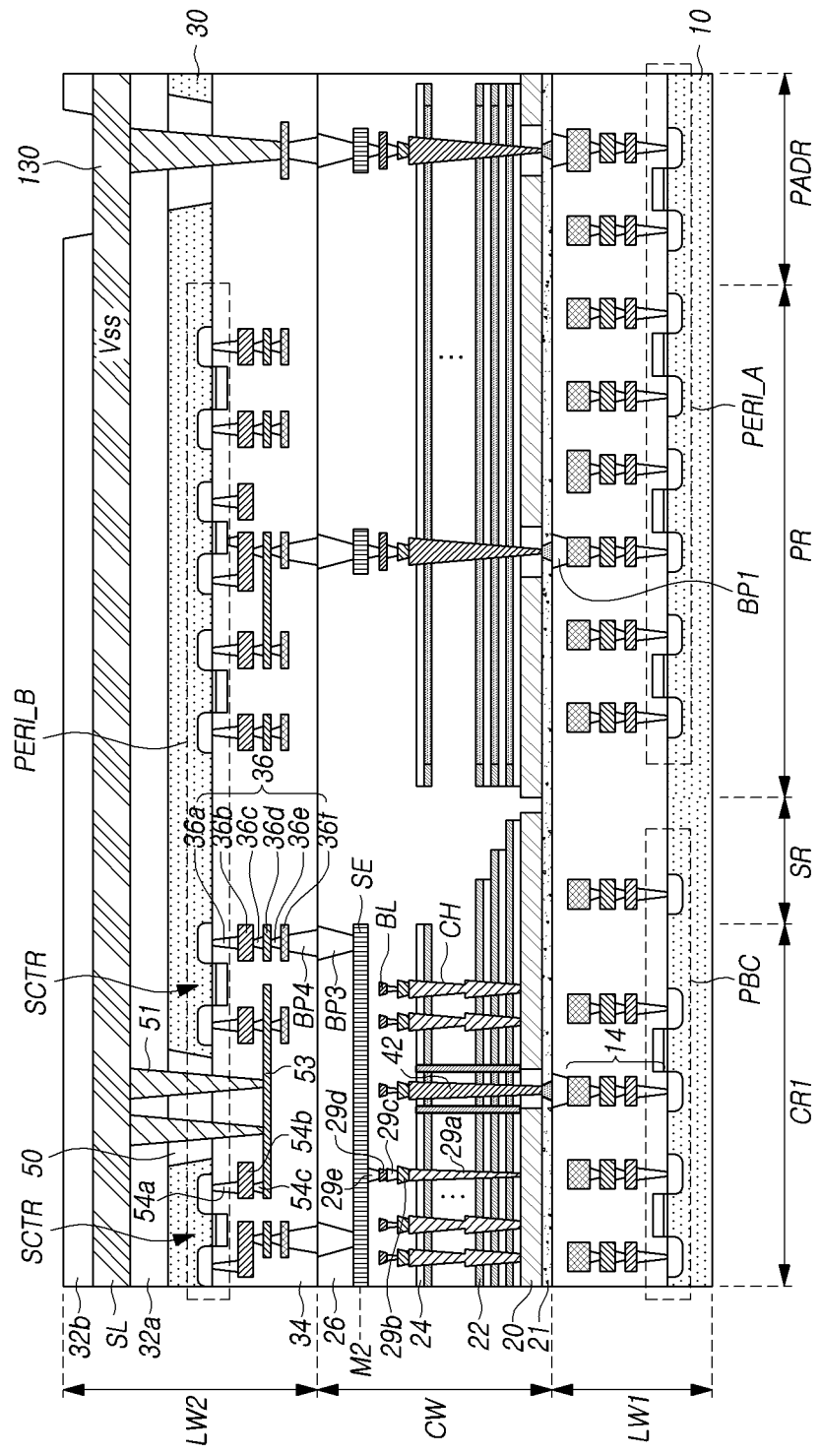
FIG. 7 is a cross-sectional view illustrating a representation of a memory device in accordance with an embodiment of the disclosure.

FIG. 7 is a cross-sectional view illustrating a representation of a memory device in accordance with an embodiment of the disclosure.

Referring to FIG. 7, a source electrode SE may be disposed in a wiring layer M2 over the bit lines BL in the first cell region CR1. As aforementioned with reference to FIGS. 5 and 6, because the wiring structure 43a, 43b, 42, BP1, BP2 and 14 that couples the bit line BL and the page buffer circuit PBC is configured under the bit line BL, the wiring layer M2 over the bit lines BL in the first cell region CR1 will not be used in the configuration of the wiring structure that couples the bit line BL and the page buffer circuit PBC. The source electrode SE may be disposed in the first cell region CR1 of the wiring layer M2, which is not used in the configuration of the wiring structure in FIGS. 5 and 6. The source electrode SE may have a flat plate shape corresponding to the first cell region CR1. In the first cell region CR1, the source electrode SE may overlap with the source plate 20 in the vertical direction VD.

A contact structure 29a to 29e, which is coupled to the source plate 20 through the stack structure, may be defined under the source electrode SE in order to couple the source electrode SE and the source plate 20. While FIG. 7 illustrates only one contact structure 29a to 29e for the sake of simplicity in illustration, a plurality of contact structures may be coupled in parallel between the source electrode SE and the source plate 20.

A plurality of bonding pads BP3 may be coupled in common to the source electrode SE. A plurality of source transistors SCTR may be defined on the bottom surface of the second substrate 30 of the second logic wafer LW2. Each of a plurality of bonding pads BP4, which are defined on the one surface of the second logic wafer LW2 bonded to the cell wafer CW, may be coupled to any one of source and drain regions of the source transistor SCTR through a contact structure 36a to 36f (collectively 36), which is defined in the dielectric layer 34. A source line SL may be defined on the dielectric layer 32a, which covers the top surface of the second substrate 30.

The source line SL may extend from the first cell region CR1 to the pad region PADR. The dielectric layer 32b may be defined on the dielectric layer 32a to cover the source line SL. The dielectric layer 32b may expose a portion of the source line SL in the pad region PADR. The source line SL, which is exposed by the dielectric layer 32b, may configure the external coupling pad 130 for a ground voltage Vss.

In the first cell region CR1, the source line SL may overlap with the source electrode SE in the vertical direction VD. In the first cell region CR1, a plug 51, which passes through the dielectric layer 32a and an isolation dielectric layer 50 and is coupled to a wiring line 53 in the dielectric layer 34, may be defined under the source line SL. The wiring line 53 may be coupled to the other of the source and drain regions of the source transistor SCTR through a contact structure 54a to 54c.

The plug 51, the wiring line 53, the contact structure 54a to 54c, the source transistor SCTR, the contact structure 36a to 36f and the bonding pads BP3 and BP4 are coupled in series between the source line SL and the source electrode SE and may constitute one electrical path. A plurality of electrical paths may be coupled in parallel between the source line SL and the source electrode SE.

In a read operation or a verify operation, the ground voltage Vss from the source line SL is provided to the source plate 20, and ideally, the source plate 20 should be at a ground level. However, because the source plate 20 self-acts as a resistor and current directed to the source plate 20 through the vertical channels CH from the bit lines BL in the read operation or the verify operation is large, the potential of the source plate 20 may rise. This is referred to as a source line bouncing phenomenon. As a result, sensing current of a read target memory cell (or a verify target memory cell) may decrease because of the resistance of the source plate 20, and due to this fact, the memory cell may be recognized as a programmed cell even though the threshold voltage of the memory cell is lower than a read voltage (or a verify voltage). Accordingly, in the case of the read operation, a read fail, in which a memory cell not programmed is read as a programmed cell, may occur, and in the case of the verify operation, an under program, in which a memory cell not completely programmed is recognized as a completely programmed cell and thus is not programmed any more in a next program operation, may occur.

The electrical path that couples the source line SL and the source electrode SE will be configured in an overlapping region between the source electrode SE and the source line SL. The contact structure 29a to 29e that couples the source electrode SE and the source plate 20 may be configured in an overlapping region between the source electrode SE and the source plate 20.

Because the source electrode SE may be configured in a flat plate shape corresponding to the first cell region CR1 by utilizing an unused region of the wiring layer M2 over the bit lines BL, it is possible to increase the overlapping area between the source electrode SE and the source line SL and the overlapping area between the source electrode SE and the source plate 20. Accordingly, it is possible to increase the number of electrical paths coupling the source line SL and the source electrode SE and the number of contact structures 29a to 29e coupling the source electrode SE and the source plate 20, and it is possible to reduce the spacing between adjacent contact structures 29a to 29e. Consequently, it is possible to suppress the potential of the source plate 20 from rising due to the resistance of the source plate 20, thereby decreasing the source line bouncing phenomenon.

Figure 8:
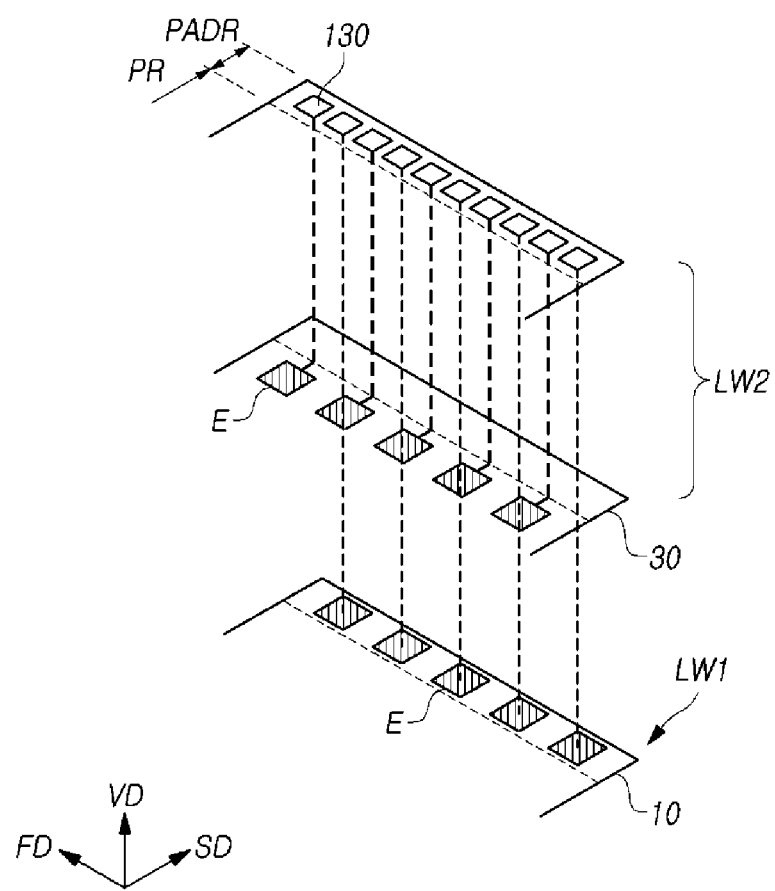
FIG. 8 is a view illustrating a representation of a layout of electrostatic discharge (ESD) elements of a memory device in accordance with an embodiment of the disclosure.

FIG. 8 is a view illustrating a representation of a layout of electrostatic discharge (ESD) elements of a memory device in accordance with an embodiment of the disclosure.

Referring to FIG. 8, a memory device may include a plurality of ESD elements E, which are coupled to a plurality of external coupling pads 130. The ESD elements E function to protect an internal circuit by discharging charges when a strong voltage is applied to the external coupling pad 130. In order to perform such a function, the ESD element E may have a larger planar size or area than the external coupling pad 130.

Some of the ESD elements E may be disposed on the first substrate 10 of the first logic wafer LW1 in the pad region PADR. The remaining ESD elements E may be disposed on the second substrate 30 of the second logic wafer LW2 in the peripheral region PR. By dividing the ESD elements E and disposing them on two substrates rather than one substrate, and by disposing some of the ESD elements E in the peripheral region PR, the memory device in accordance with the present embodiment may contribute to suppressing an increase in the area of the pad region PADR, in which the presence of fewer ESD elements E reduces the size of the pad region PADR.

Figure 9:
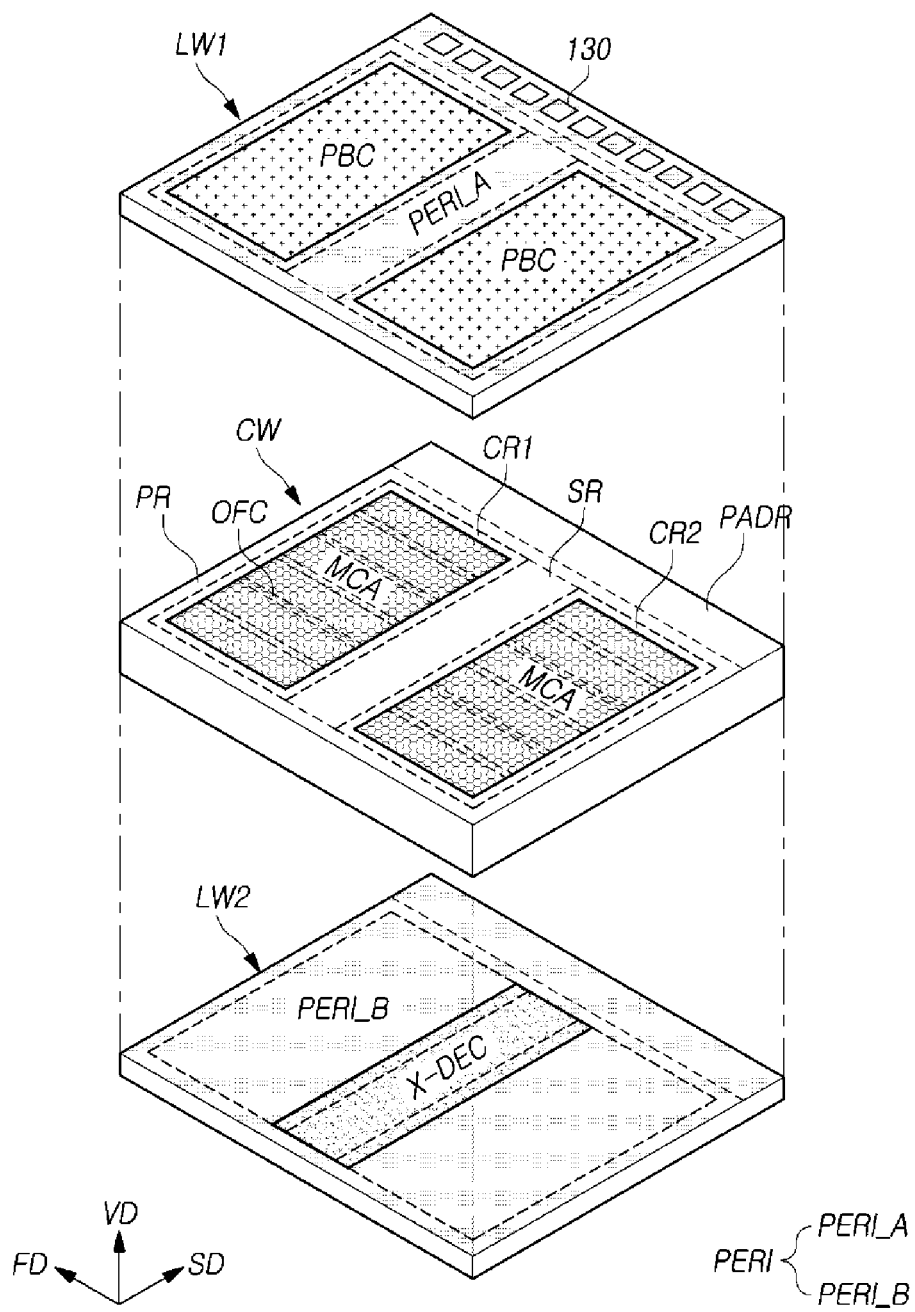
FIG. 9 is a diagram illustrating a representation of an example of a schematic structure of a memory device in accordance with an embodiment of the disclosure.

FIG. 9 is a diagram schematically illustrating a representation of a schematic structure of a memory device in accordance with an embodiment of the disclosure.

Referring to FIG. 9, the first logic wafer LW1 including the page buffer circuit PBC and the first peripheral circuit PERI_A may be bonded to the top of the cell wafer CW, and the second logic wafer LW2 including the row decoder X-DEC and the second peripheral circuit PERI_B may be bonded to the bottom of the cell wafer CW. The plurality of external coupling pads 130 may be disposed in the pad region PADR of the top surface of the first logic wafer LW1.

Figure 10:
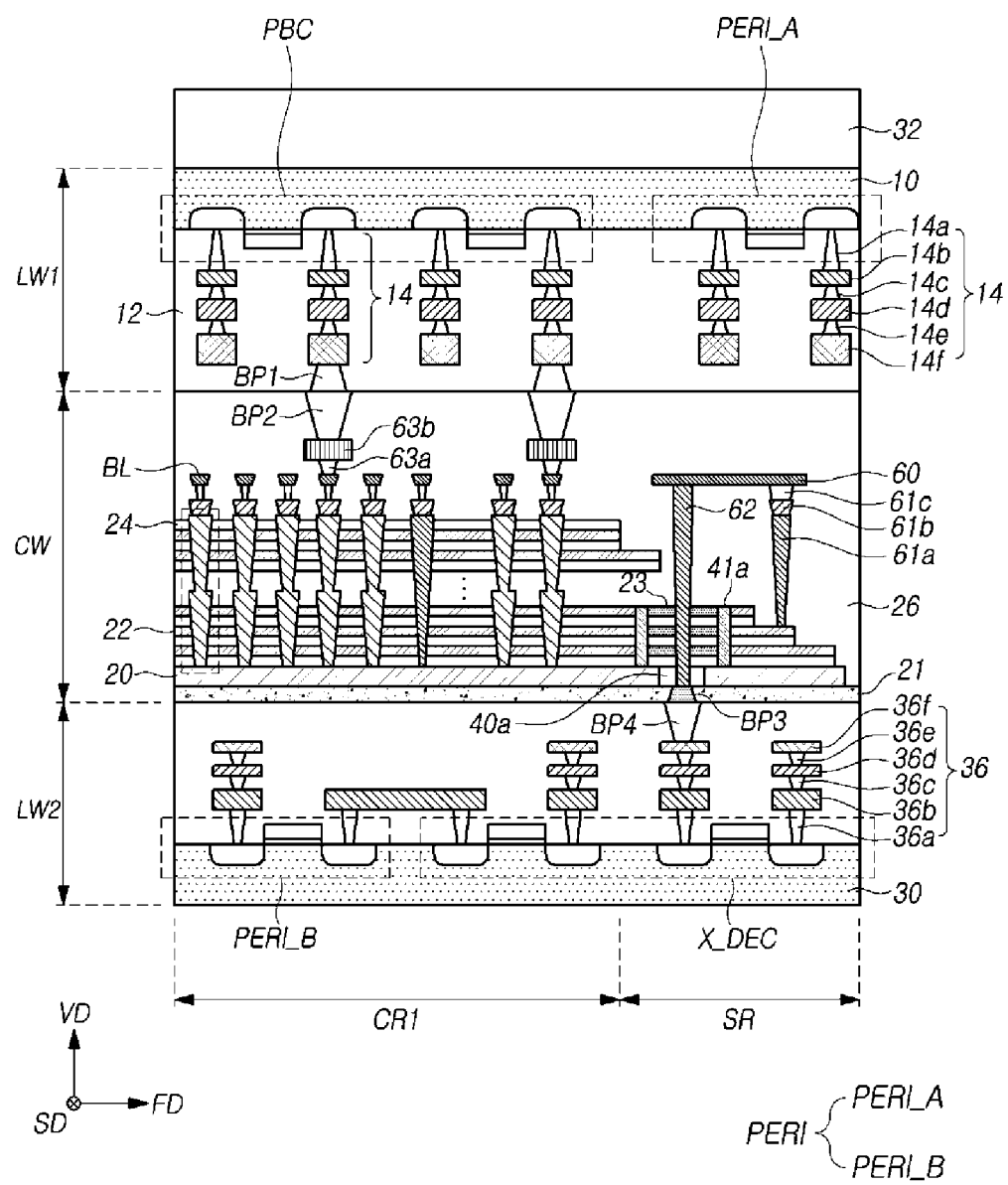
FIG. 10 is a cross-sectional view taken in an FD direction of FIG. 9.

FIG. 10 is a cross-sectional view taken in an FD direction illustrating a part of FIG. 9. FIG. 10 illustrates a cross-section taken through the first cell region CR1 and the slimming region SR in the first direction FD.

Referring to FIG. 10, the cell wafer CW may include the source plate 20 and the stack structure that is disposed on the source plate 20.

An etch barrier 41a, which passes through the stack structure, may be defined in the slimming region SR. In the slimming region SR, the stack structure may have a stairway structure, and the etch barrier 41a may pass through the stairway structure of the stack structure. The etch barrier 41a may be provided in a shape that surrounds a portion of the stack structure in the slimming region SR. The stack structure may have different structures due to the presence of the etch barrier 41a. In detail, the stack structure that is surrounded by the etch barrier 41a may have a structure (hereinafter, referred to as a 'dielectric stack of the stack structure') in which the plurality of dielectric layers 23 and the plurality of interlayer dielectric layers 24 are alternately stacked, and the stack structure outside the etch barrier 41a may have a structure in which the plurality of electrode layers 22 and the plurality of interlayer dielectric layers 24 are alternately stacked.

In the slimming region SR, the isolation dielectric layer 40a, which passes through the source plate 20, may be defined. The isolation dielectric layer 40a may be disposed under the dielectric stack of the stack structure.

A wiring line 60 may be defined in the dielectric layer 26. The wiring line 60 may be disposed at the same layer as the bit lines BL. The wiring line 60 may be coupled to the electrode layer 22 through a contact structure 61a to 61c, which is defined in the dielectric layer 26. A contact 62, which passes through the dielectric layer 26, the dielectric stack of the stack structure and the isolation dielectric layer 40a and is coupled to the bonding pad BP3, may be defined under the wiring line 60. The electrode layer 22 may be coupled to the bonding pad BP3 through the contact structure 61a to 61c, the wiring line 60 and the contact 62.

The bonding pad BP3 may be bonded to the bonding pad BP4 of the second logic wafer LW2, and may be coupled to the row decoder X-DEC through the contact structure 36a to 36f (collectively 36) coupled to the bonding pad BP4. While FIG. 10 illustrates, for the sake of simplicity in illustration, that one electrode layer 22 is coupled to the row decoder X-DEC, it should be understood that the plurality of electrode layers 22 are coupled to the row decoder X-DEC through individual electrical paths, respectively.

The bonding pads BP2 may be defined on the one surface of the cell wafer CW, which is bonded to the first logic wafer LW1. The bonding pad BP2 may be coupled to the bit line BL through a contact structure 63a and 63b, which is defined in the dielectric layer 26. While FIG. 10 illustrates, for the sake of simplicity in illustration, only the bonding pads BP2, which are coupled to some bit lines BL, it should be understood that a plurality of bonding pads BP2, which are coupled to the bit lines BL, respectively, are defined on the one surface of the cell wafer CW.

The first logic wafer LW1 may include, on the one surface thereof bonded to the cell wafer CW, bonding pads BP1, which are bonded to the bonding pads BP2. The bonding pad BP1 may be coupled to the page buffer circuit PBC through the contact structure 14a to 14f (collectively 14), which is defined in the dielectric layer 12.

FIGS. 11 to 26 are views illustrating representations of examples of memory devices in accordance with embodiments of the disclosure.

FIGS. 11 to 26 are views for facilitating the understanding of the disclosure, and it should be noted that FIGS. 11 to 26 are not cross-sections taken in a specific direction. The embodiments to be described with reference to FIGS. 11 to 26 illustrate a first logic wafer LW1 bonded to the bottom of a cell wafer CW and a second logic wafer LW2 bonded to the top of the cell wafer CW, but it should be understood that in other embodiments the first logic wafer LW1 may be bonded to the top of the cell wafer CW and the second logic wafer LW2 may be bonded to the bottom of the cell wafer CW.

Figure 11:
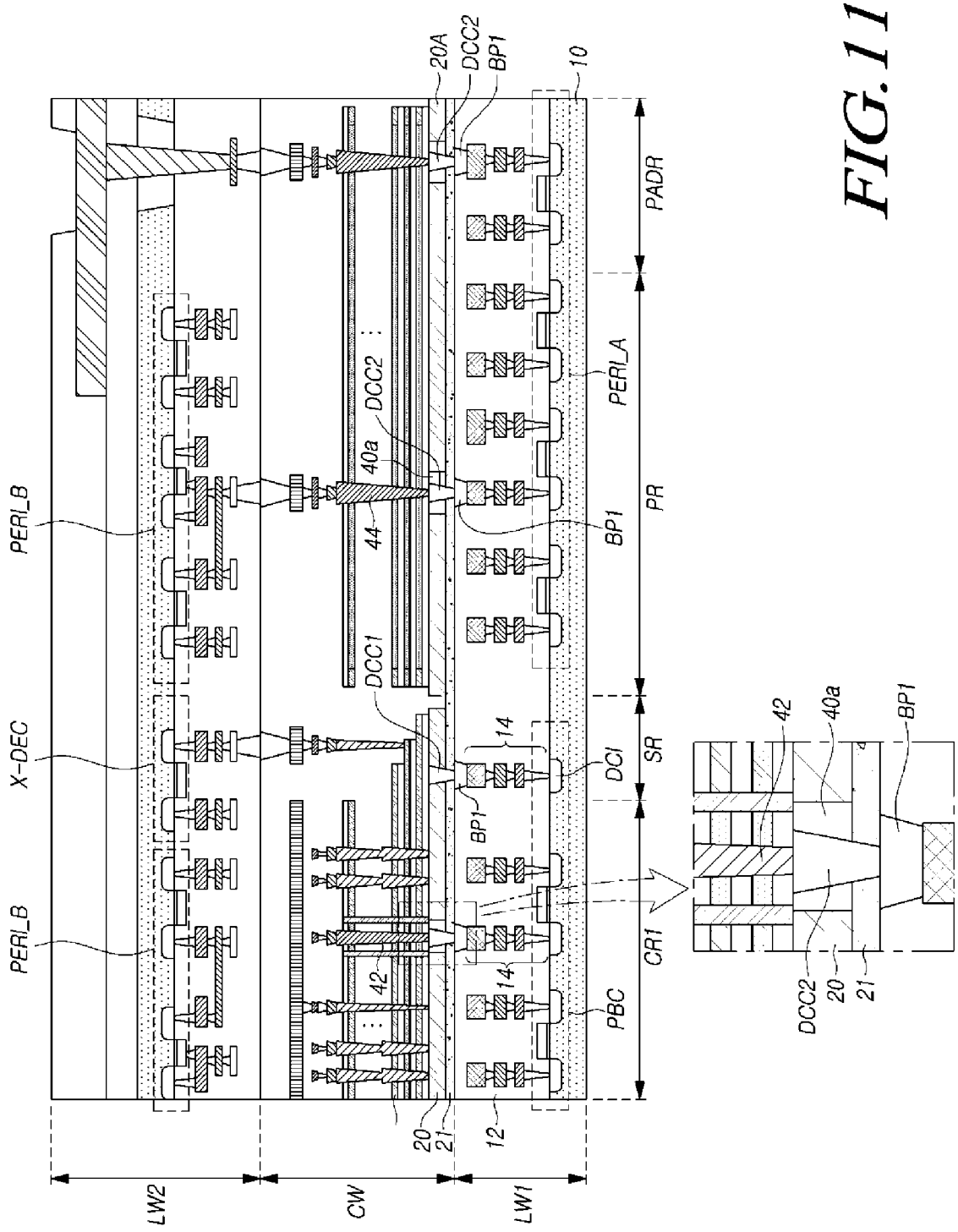
FIGS. 11 to 26 are views illustrating representations of examples of memory devices in accordance with embodiments of the disclosure.

Referring to FIG. 11, a discharge impurity region DCI may be defined in an active region of a first substrate 10 of the first logic wafer LW1. The discharge impurity region DCI may include a conductive impurity, which forms a PN diode. The discharge impurity region DCI may be used as a path for discharging charges accumulated in a source plate 20 of the cell wafer CW.

The first logic wafer LW1 may include a first logic circuit. The first logic circuit may include a page buffer circuit PBC and a first peripheral circuit PERI_A. A plurality of bonding pads BP1 may be defined on one surface of the first logic wafer LW1, which is bonded to the cell wafer CW.

Each of the plurality of bonding pads BP1 may be coupled to one of the discharge impurity region DCI and the first logic circuit through a contact structure 14, which is defined in a dielectric layer 12.

The source plate 20 may be passed through by a conductive contact plug DCC1 and be electrically coupled to the conductive contact plug DCC1. The conductive contact plug DCC1 may pass through the source plate 20 and a base dielectric layer 21, and thereby, may be coupled to the bonding pad BP1, which is coupled to the discharge impurity region DCI. The charges accumulated in the source plate 20 may be discharged to the first substrate 10 through the discharge impurity region DCI via the conductive contact plug DCC1, the bonding pad BP1 and the contact structure 14.

A plurality of conductive contact plugs DCC2, which pass through an isolation dielectric layer 40a and the base dielectric layer 21 and are coupled to the bonding pads BP1, respectively, of the first logic wafer LW1, may be defined. The conductive contact plugs DCC2 may be formed together with the conductive contact plug DCC1 when the conductive contact plug DCC1 is formed.

A contact 42, which passes through a dielectric stack of a stack structure, and a contact 44, which passes through a dielectric stack of a dummy stack structure, may be coupled to the conductive contact plugs DCC2, respectively.

Figure 12:
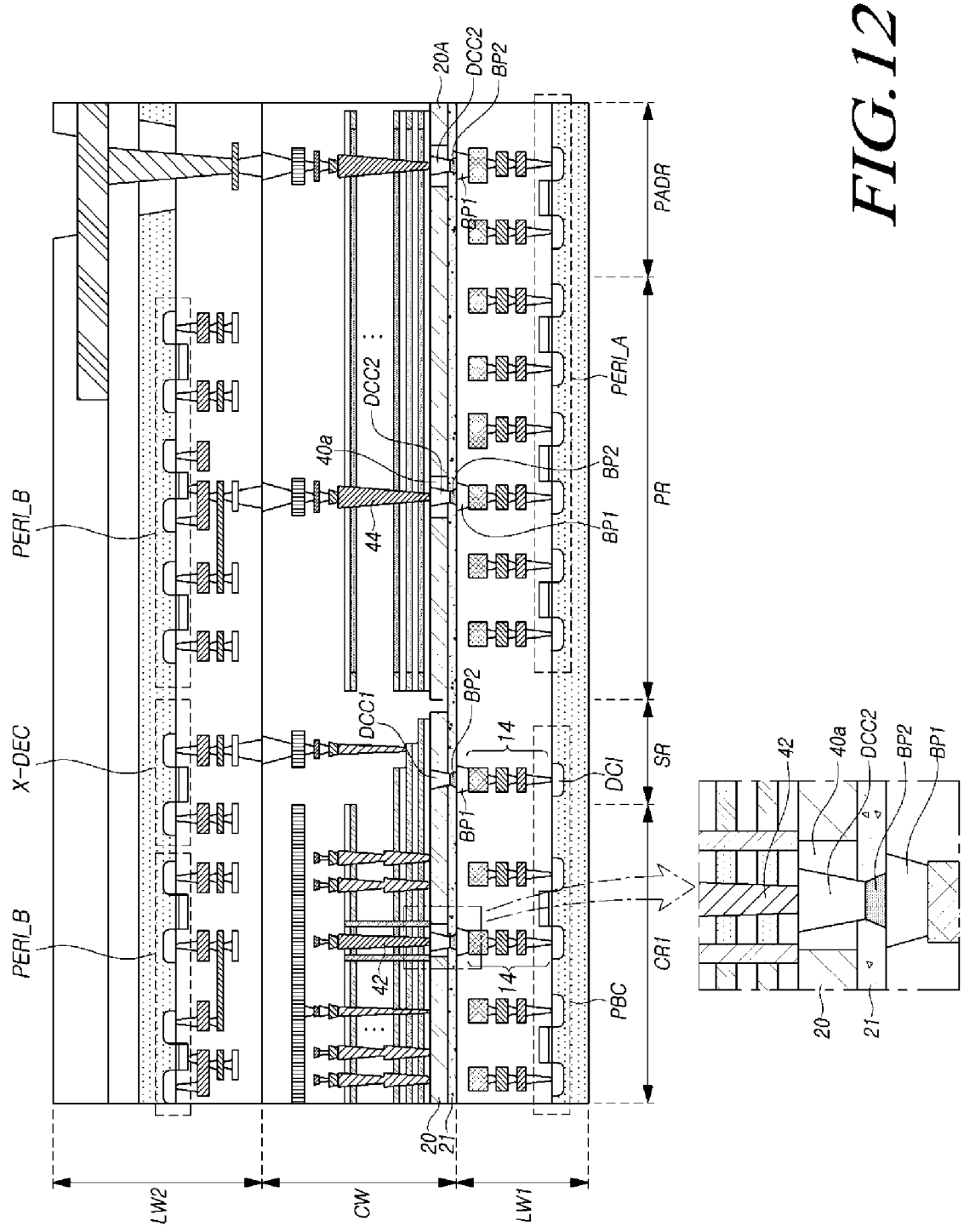

Referring to FIG. 12, the cell wafer CW may include bonding pads BP2, which are bonded to the bonding pads BP1 of the first logic wafer LW1, on one surface thereof, which is bonded to the first logic wafer LW1.

The source plate 20 may be passed through by a conductive contact plug DCC1 and be electrically coupled to the conductive contact plug DCC1. The conductive contact plug DCC1 may pass through the source plate 20 and be coupled to one of the plurality of bonding pads BP2.

Conductive contact plugs DCC2, which pass through the isolation dielectric layer 40a, may be defined under the contacts 42 and 44. The conductive contact plug DCC2 may pass through the isolation dielectric layer 40a and be coupled to one of the plurality of bonding pads BP2. The conductive contact plugs DCC2 may be formed together with the conductive contact plug DCC1 when the conductive contact plug DCC1 is formed. The contact 42 may pass through the dielectric stack of the stack structure and be coupled to one of the conductive contact plugs DCC2, and the contact 44 may pass through the dielectric stack of the dummy stack structure and be coupled to another one of the conductive contact plugs DCC2.

The bonding pads BP2 may pass through the base dielectric layer 21 from the bottom surface of the base dielectric layer 21, and may be coupled to the conductive contact plugs DCC1 and DCC2, respectively. The bonding pads BP2 may be formed by forming holes that pass through the base dielectric layer 21 from the bottom surface of the base dielectric layer 21 and filling the holes with a conductive material. Each hole may have a side slope due to an etch loading during an etching process for forming the hole. Due to such a characteristic in process, the width of each bonding pad BP2 may gradually narrow from the bottom to the top.

Figure 13:
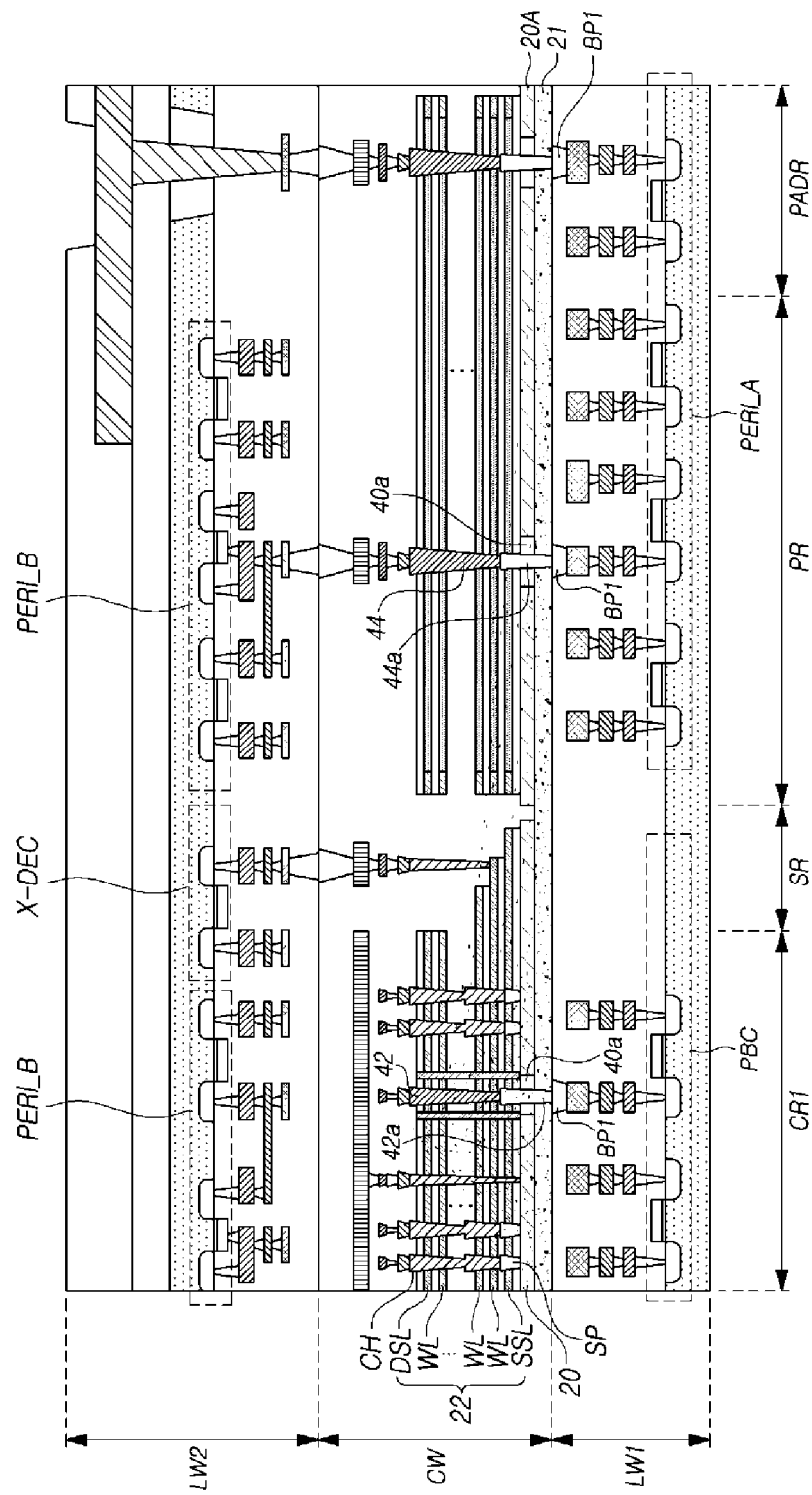

Referring to FIG. 13, a semiconductor pillar SP may be formed between a vertical channel CH and the source plate 20. The semiconductor pillar SP may be disposed on the top surface of the source plate 20, and may pass through a source select line SSL. The vertical channel CH and the semiconductor pillar SP may be electrically coupled to each other. The semiconductor pillar SP may be a semiconductor of the same conductivity type as the source plate 20 or an intrinsic semiconductor. For example, the semiconductor pillar SP may be a single crystal intrinsic semiconductor or a semiconductor having p-type conductivity.

A bonding contact 42a may be formed between the contact 42 and the bonding pad BP1 of the first logic wafer LW1. The contact 42 may pass through an upper part of the dielectric stack of the stack structure and be coupled to the bonding contact 42a. The bonding contact 42a may pass through a lower part of the dielectric stack of the stack structure, the isolation dielectric layer 40a and the base dielectric layer 21, and may be bonded to the bonding pad BP1 of the first logic wafer LW1. The bonding contact 42a may electrically couple the contact 42 and the bonding pad BP1 of the first logic wafer LW1.

A bonding contact 44a may be formed between the contact 44 and the bonding pad BP1 of the first logic wafer LW1. The contact 44 may pass through an upper part of the dielectric stack of the dummy stack structure and be coupled to the bonding contact 44a. The bonding contact 44a may pass through a lower part of the dielectric stack of the dummy stack structure, the isolation dielectric layer 40a and the base dielectric layer 21, and may be bonded to the bonding pad BP1 of the first logic wafer LW1. The bonding contact 44a may electrically couple the contact 44 and the bonding pad BP1 of the first logic wafer LW1.

For example, the top surfaces of the bonding contact 42a and the bonding contact 44a may be disposed on the same plane as the top surface of the semiconductor pillar SP. The top ends of the semiconductor pillar SP, the bonding contact 42a and the bonding contact 44a may project upward from the top surface of the source select line SSL.

Figure 14:
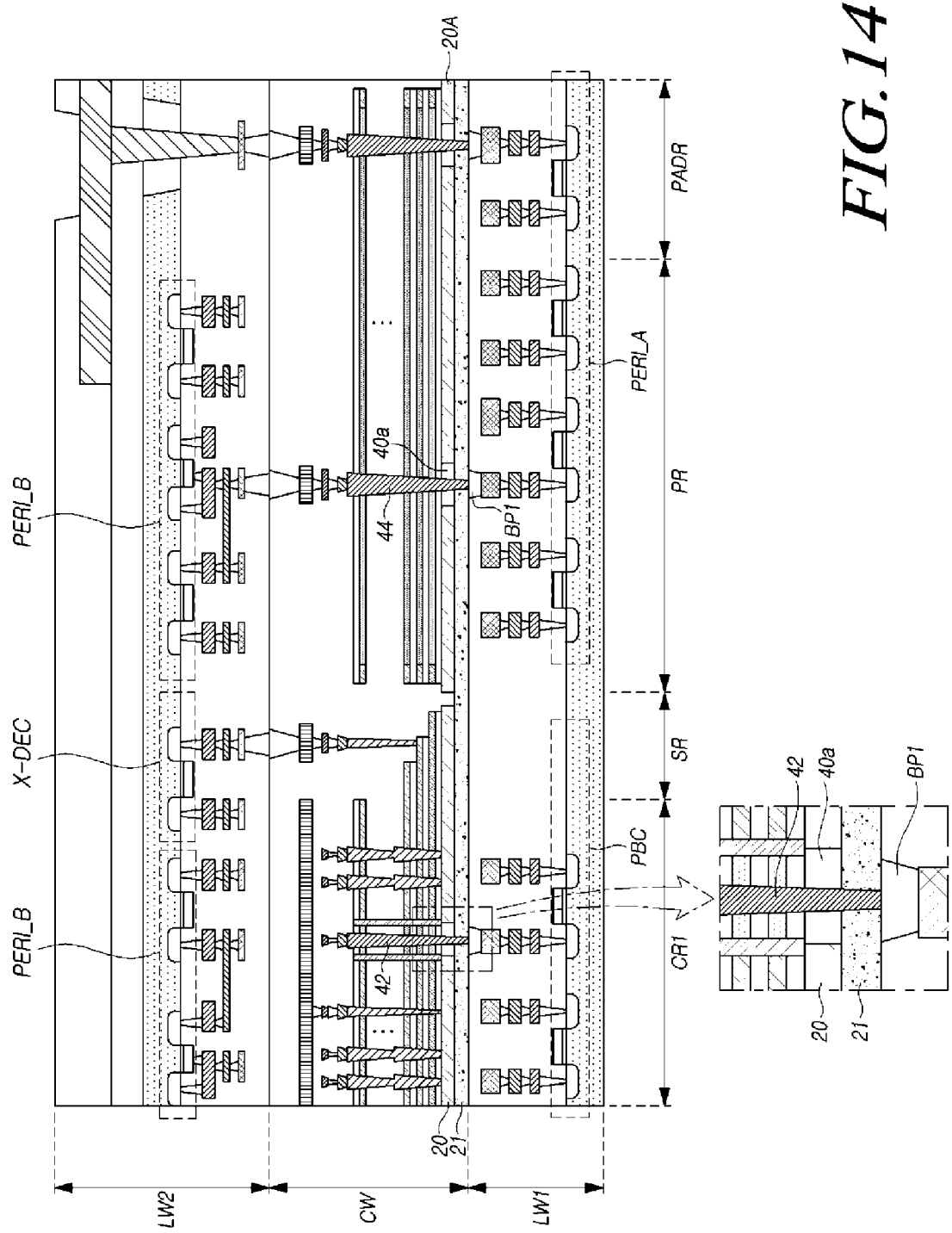

Referring to FIG. 14, the contact 42 may pass through the dielectric stack of the stack structure, the isolation dielectric layer 40a and the base dielectric layer 21, and may be directly coupled to the bonding pad BP1 of the first logic wafer LW1.

The contact 44 may pass through the dielectric stack of the dummy stack structure, the isolation dielectric layer 40a and the base dielectric layer 21, and may be directly coupled to the bonding pad BP1 of the first logic wafer LW1. After the stack structure and the dummy stack structure are formed, the cell wafer CW may be bonded to the first logic wafer LW1. The contacts 42 and 44 may be formed by forming a hole that passes through the dielectric stack of the stack structure, the isolation dielectric layer 40a and the base dielectric layer 21 and exposes the bonding pad BP1, and by forming a hole that passes through the dielectric stack of the dummy stack structure, the isolation dielectric layer 40a and the base dielectric layer 21 and exposes the bonding pad BP1, and by filling the holes with a conductive material. As a result of this process, the contacts 42 and 44 may have widths that become narrow toward the bottom ends thereof.

Figure 15:
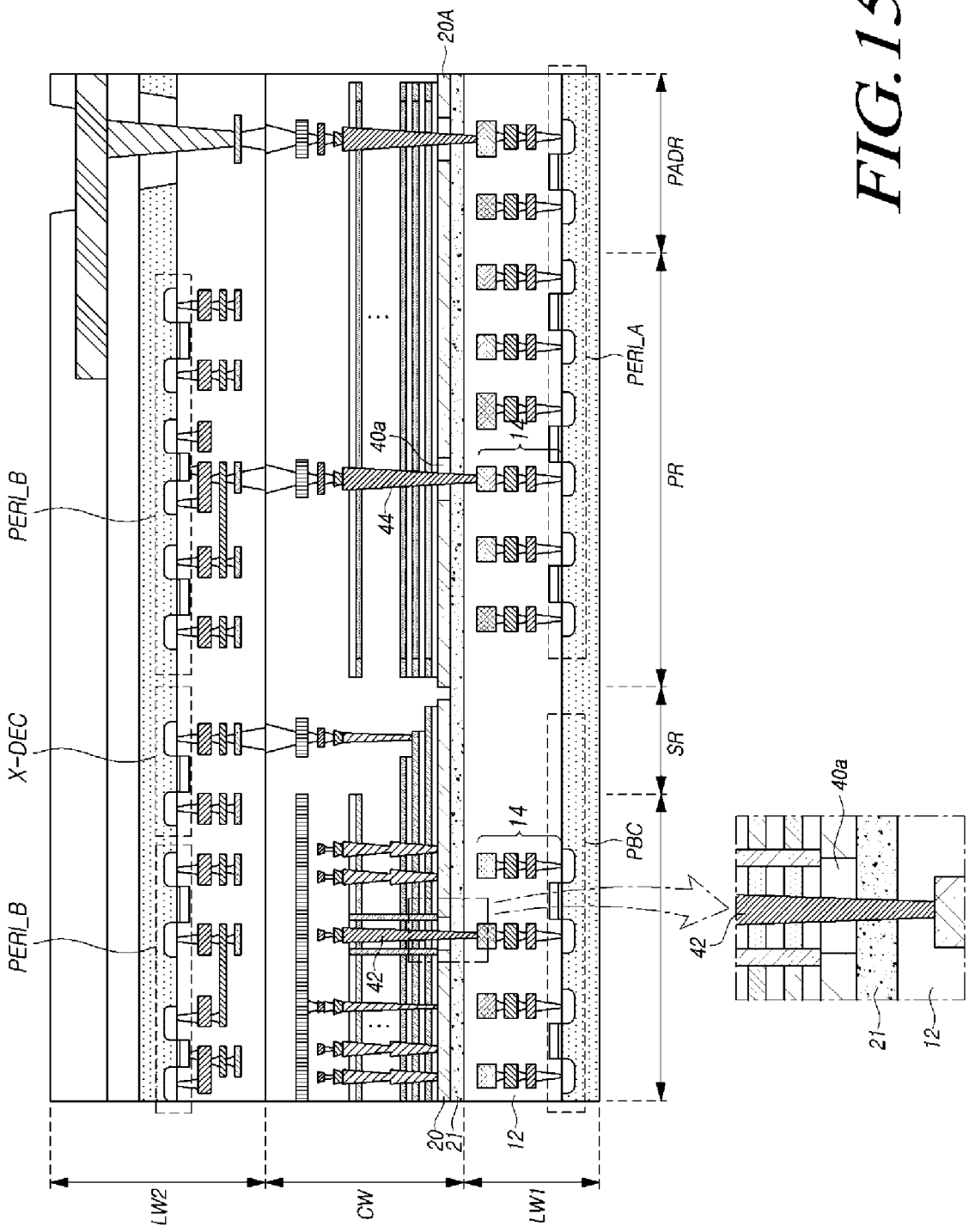

Referring to FIG. 15, each of the contacts 42 and 44 may pass through the bonding surface between the cell wafer CW and the first logic wafer LW1, and may be directly coupled to the contact structure 14, which is defined in the dielectric layer 12 of the first logic wafer LW1.

The contact 42 may pass through the dielectric stack of the stack structure, the isolation dielectric layer 40a, the base dielectric layer 21 and the dielectric layer 12. The contact 44 may pass through the dielectric stack of the dummy stack structure, the isolation dielectric layer 40a, the base dielectric layer 21 and the dielectric layer 12.

Figure 16:
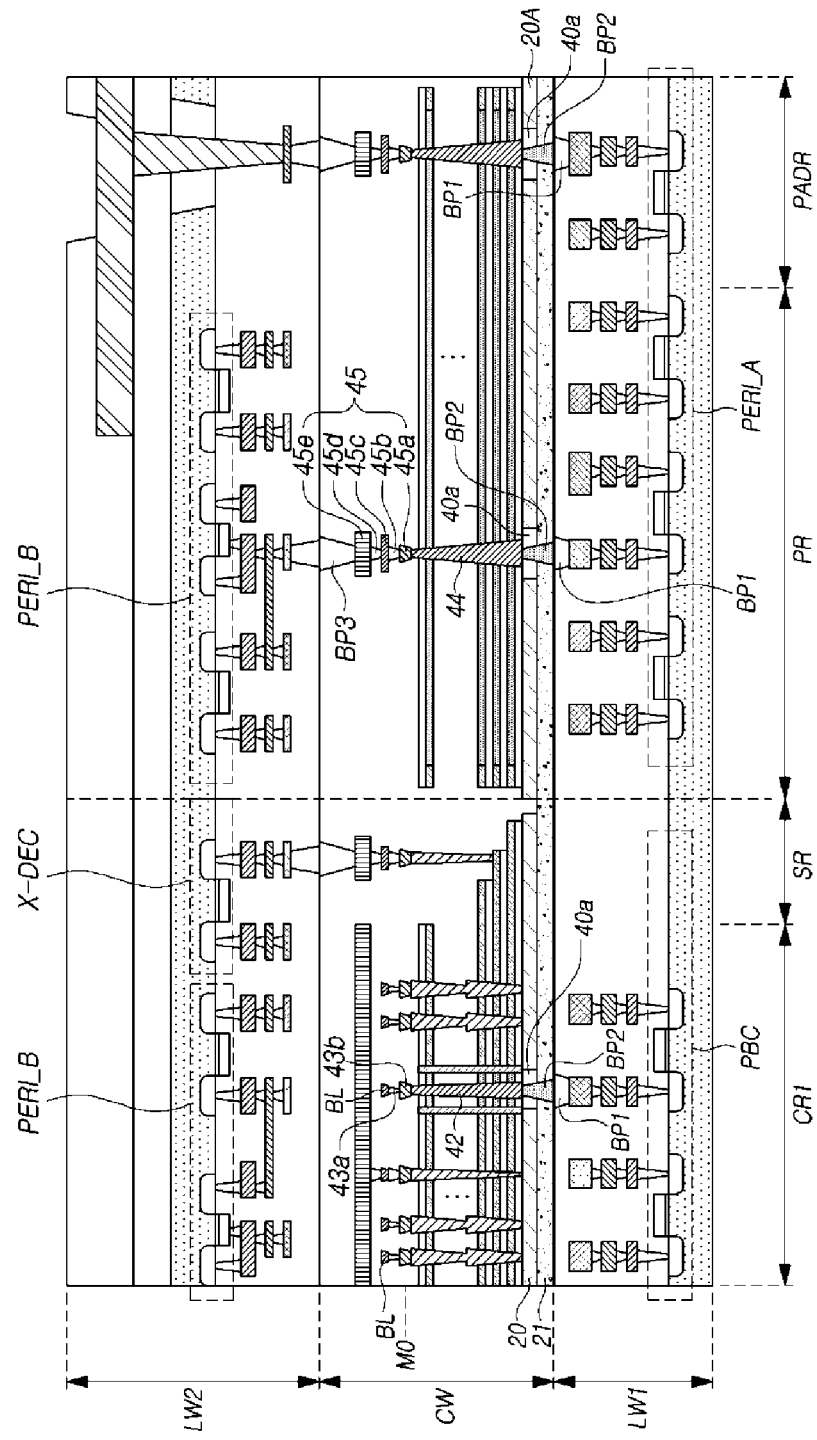

Referring to FIG. 16, a wiring line 43b may be defined in a wiring layer M0 between the stack structure and the bit line BL. The wiring line 43b may be coupled to the bit line BL through a contact 43a. In the wiring layer M0, a wiring line 45a, which is coupled to a bonding pad BP3 through a contact structure 45b to 45e, may be defined.

The contact 42 may pass through the dielectric stack of the stack structure and be coupled to the wiring line 43b over the stack structure. The contact 44 may pass through the dielectric stack of the dummy stack structure and be coupled to the wiring line 45a over the dummy stack structure.

The contact 42 may be formed by forming a hole passing through the stack structure from the bottom end of the stack structure in contact with the isolation dielectric layer 40a and filling the hole with a conductive material. The hole may have a side slope due to an etch loading during an etching process for forming the hole. Due to such a process characteristic, the width of the contact 42 may become narrow from the bottom to the top thereof. The contact 44 may be formed together with the contact 42 when the contact 42 is formed. Like the contact 42, the contact 44 may have a width that decreases from the bottom to the top thereof. The bonding pads BP2 may pass through the base dielectric layer 21 and the isolation dielectric layer 40a and be coupled to the contacts 42 and 44, respectively. The bonding pads BP2 may be formed by forming holes passing through the isolation dielectric layer 40a and the base dielectric layer 21 from the bottom surface of the isolation dielectric layer 40a and filling the holes with a conductive material. The width of each bonding pad BP2 may become narrow from the bottom to the top.

Figure 17:
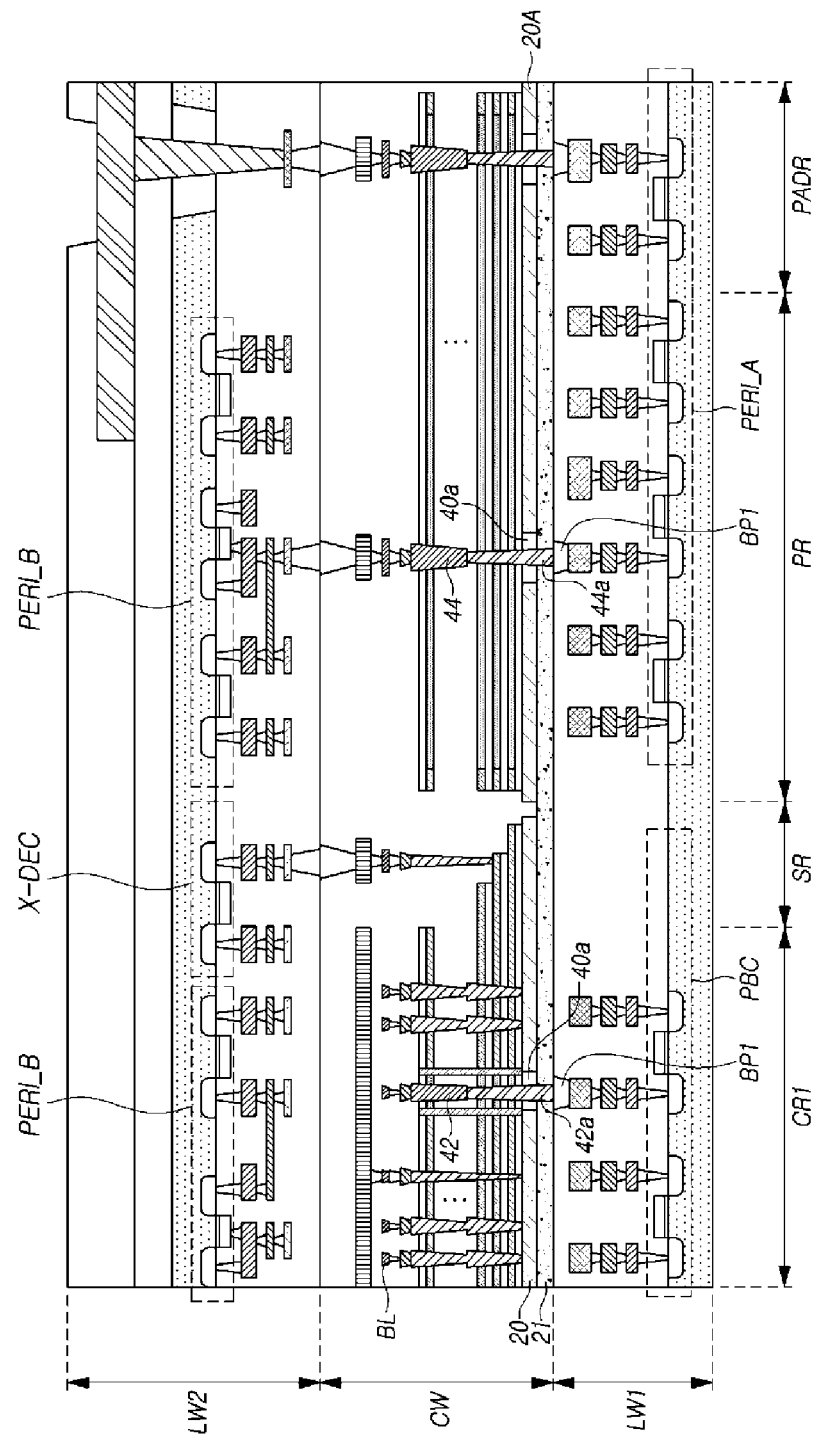

Referring to FIG. 17, the contact 42 may pass through an upper part of the dielectric stack of the stack structure. The contact 44 may pass through an upper part of the dielectric stack of the dummy stack structure.

A bonding contact 42a may be defined under the contact 42 and be coupled to the contact 42. A bonding contact 44a may be defined under the contact 44 and be coupled to the contact 44. The bonding contact 42a may be coupled to the contact 42 by passing through the base dielectric layer 21, the isolation dielectric layer 40a and the lower part of the dielectric stack of the stack structure from the one surface of the cell wafer CW in contact with the first logic wafer LW1. The bonding contact 44a may be coupled to the contact 44 by passing through the base dielectric layer 21, the isolation dielectric layer 40a and the lower part of the dielectric stack of the dummy stack structure from the one surface of the cell wafer CW.

The bonding contact 42a may be formed by forming a hole that passes through the base dielectric layer 21, the isolation dielectric layer 40a and the lower part of the dielectric stack of the stack structure from the bottom surface of the base dielectric layer 21 and that exposes the contact 42, and by filling the hole with a conductive material. The hole may have a side slope due to an etch loading during an etching process for forming the hole. As a result, the width of the bonding contact 42a may become narrow from the bottom to the top. The bonding contact 44a may be formed together with the bonding contact 42a when the bonding contact 42a is formed. Like the bonding contact 42a, the width of the bonding contact 44a may become narrow from the bottom to the top.

The bonding contacts 42a and 44a may be bonded to the bonding pads BP1 of the first logic wafer LW1, respectively.

Figure 18:
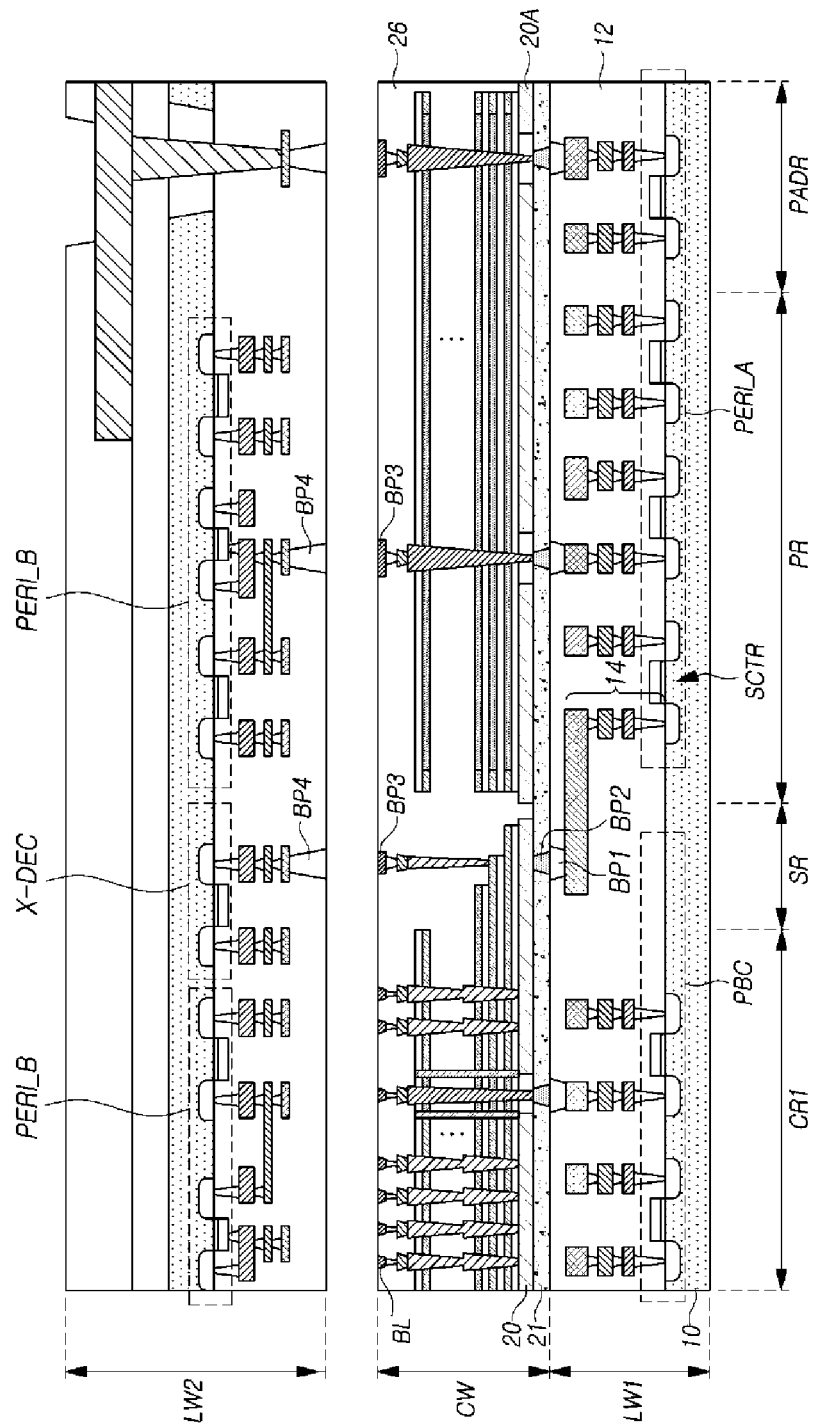

Referring to FIG. 18, the first logic wafer LW1 may include a source transistor SCTR, which is defined on the top surface of the first substrate 10. A plurality of bonding pads BP1 may be defined on one surface of the first logic wafer LW1, which is bonded to the cell wafer CW. A contact structure 14, which is coupled to any one of source/drain regions of the source transistor SCTR, may be defined in the dielectric layer 12. One of the plurality of bonding pads BP1 may be coupled to the source transistor SCTR through the contact structure 14.

A plurality of bonding pads BP2, which are bonded to the bonding pads BP1 of the first logic wafer LW1, may be defined on one surface of the cell wafer CW, which is bonded to the first logic wafer LW1. The bonding pads BP2 may pass through the base dielectric layer 21. One of the bonding pads BP2 may be coupled to the source transistor SCTR through the bonding pad BP1 and the contact structure 14. The bonding pad BP2, which is coupled to the source transistor SCTR, may pass through the base dielectric layer 21 and be electrically coupled to the source plate 20. Accordingly, a voltage from the source transistor SCTR may be provided to the source plate 20 via the contact structure 14, the bonding pad BP1 and the bonding pad BP2.

Because the source transistor SCTR is disposed in the first logic wafer LW1, a wiring layer over the bit lines BL may not be used for coupling between the source transistor SCTR and the source plate 20. The wiring layer over the bit lines BL, which is not used, may be removed. Bonding pads BP3 may be disposed at the same height level as the bit lines BL. Bonding pads BP4 of the second logic wafer LW2 may be bonded to the bonding pads BP3.

In order to facilitate understanding, FIG. 18 and FIGS. 19 to 21 to be described below illustrate that the cell wafer CW and the second logic wafer LW2 are separated from each other, but it should be understood that the other surface of the cell wafer CW and one surface of the second logic wafer LW2 are in contact with each other.

The other surface of the cell wafer CW, which is bonded to the second logic wafer LW2, may be disposed on the same plane as the top surfaces of the bit lines BL and the bonding pads BP3.

Figure 19:
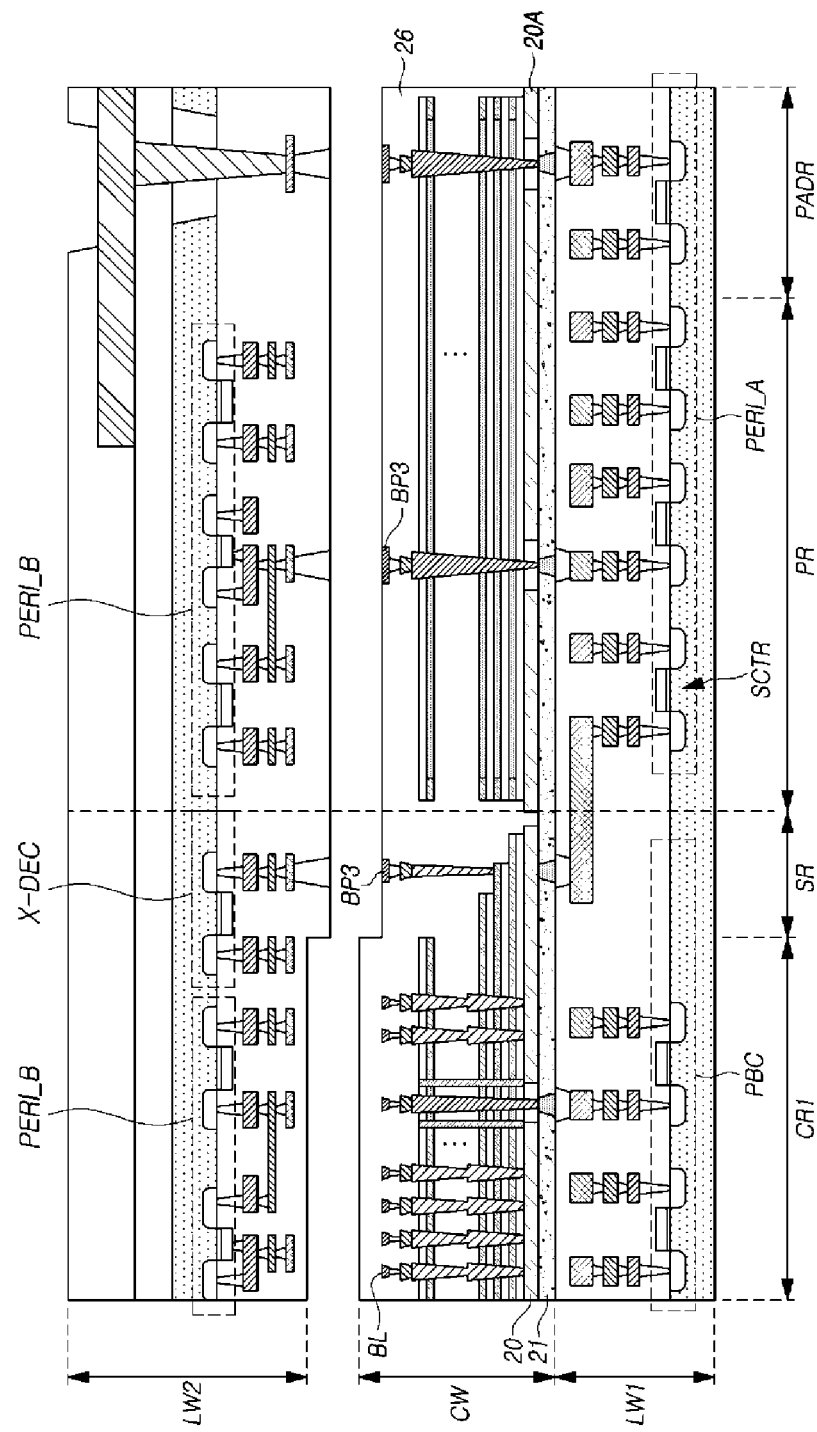

Referring to FIG. 19, the bonding pads BP3 of the cell wafer CW may be disposed at the same height level as the bit lines BL. The bit lines BL may be disposed in the first cell region CR1, and the bonding pads BP3 may be disposed outside the first cell region CR1.

In the first cell region CR1, the top surface of a dielectric layer 26 may be disposed higher than the top surfaces of the bit lines BL and the bonding pads BP3. Outside the first cell region CR1, the top surface of the dielectric layer 26 may be disposed on the same plane as the top surfaces of the bit lines BL and the bonding pads BP3. Accordingly, the top surface of the dielectric layer 26 may have a bent shape.

The top surface of the dielectric layer 26 may constitute the other surface of the cell wafer CW, which is bonded to the second logic wafer LW2. The other surface of the cell wafer CW may have a bent shape. One surface of the second logic wafer LW2, which is bonded to the other surface of the cell wafer CW, may have a bent shape corresponding to the shape of the other surface of the cell wafer CW.

Figure 20:
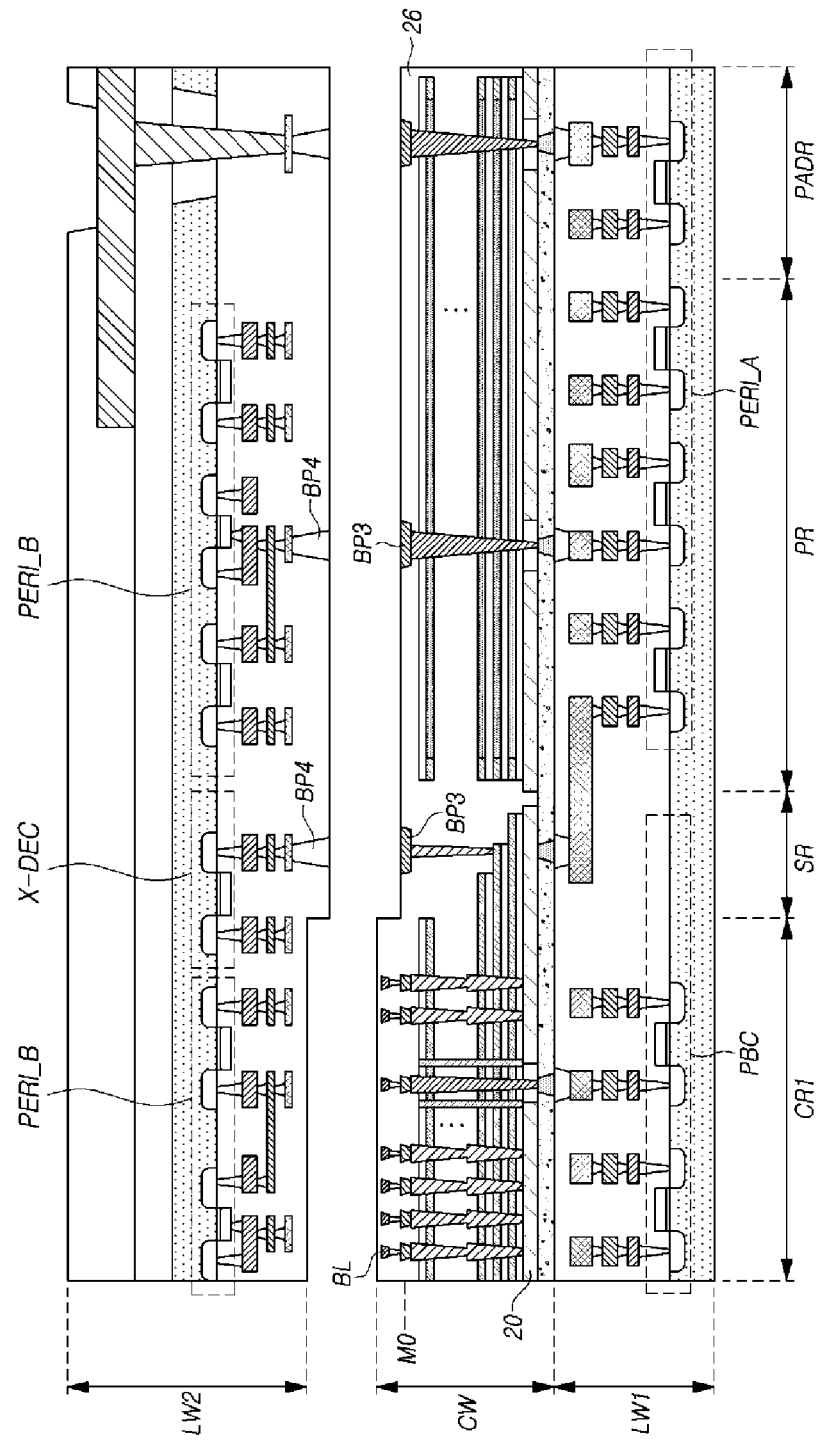

Referring to FIG. 20, the bonding pads BP3 of the cell wafer CW may be disposed in the wiring layer M0 between the stack structure and the bit lines BL. Accordingly, the vertical distance between the bonding pads BP3 and the source plate 20 may be shorter than the vertical distance between the bit lines BL and the source plate 20.

The bit lines BL may be disposed in the first cell region CR1, and the bonding pads BP3 may be disposed outside the first cell region CR1. In the first cell region CR1, the top surface of the dielectric layer 26 may be disposed higher than the top surfaces of the bit lines BL. Outside the first cell region CR1, the top surface of the dielectric layer 26 may be disposed on the same plane as the top surfaces of the bonding pads BP3. Accordingly, the top surface of the dielectric layer 26 may have a bent shape.

The top surface of the dielectric layer 26 may constitute the other surface of the cell wafer CW, which is bonded to the second logic wafer LW2. The other surface of the cell wafer CW may have a bent shape. One surface of the second logic wafer LW2, which is bonded to the other surface of the cell wafer CW, may have a bent shape corresponding to the shape of the other surface of the cell wafer CW.

Figure 21:
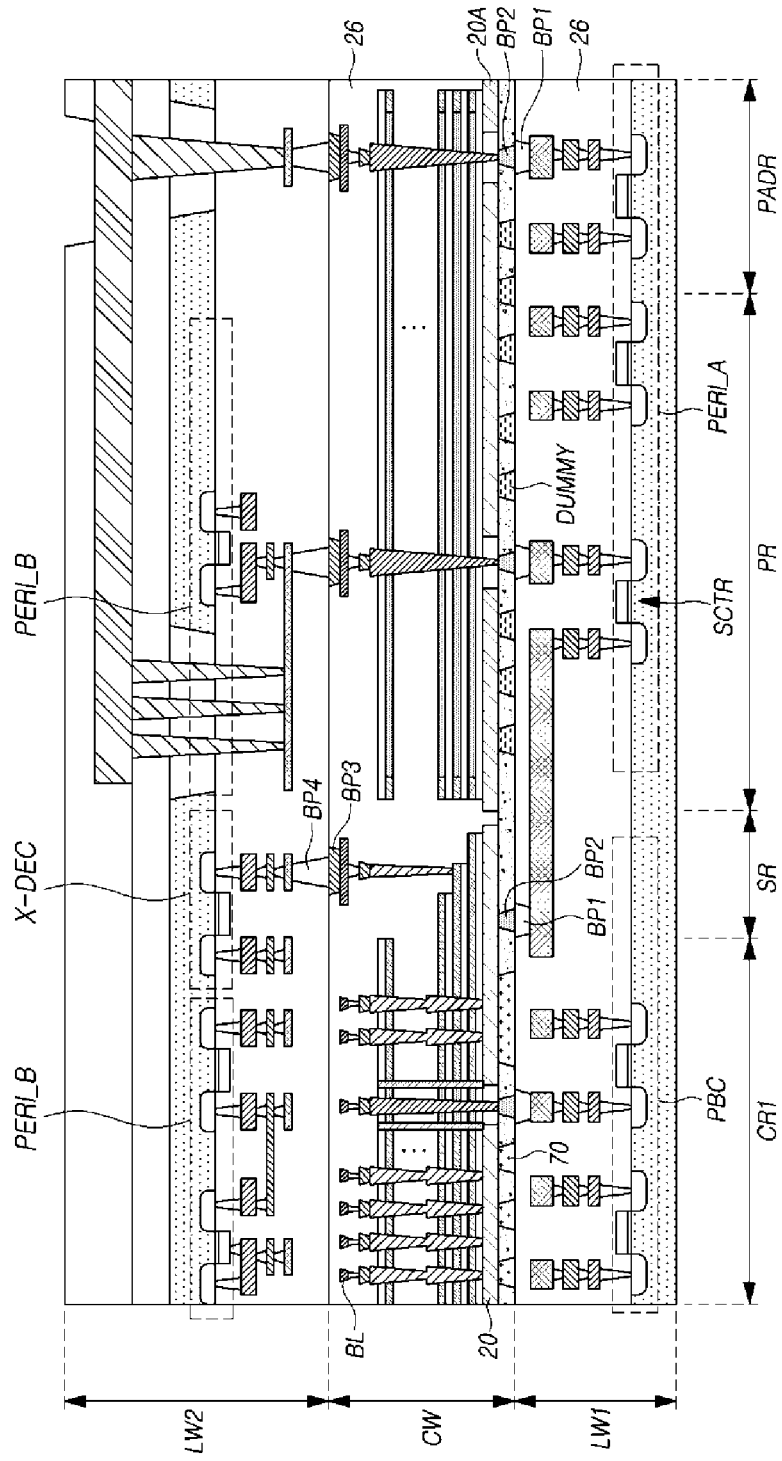

Referring to FIG. 21, the cell wafer CW may further include a metal electrode 70, which is disposed on the bottom surface of the source plate 20 and is electrically coupled to the source plate 20. The metal electrode 70, serving to transfer a source voltage to the source plate 20, may be formed of a material that has a lower resistance than the source plate 20, such as for example, tungsten.

The cell wafer CW may further include dummy electrodes DUMMY, each of which is disposed on the bottom surface of a dummy source plate 20A and has the same or a similar shape as or to the metal electrode 70. The dummy electrodes DUMMY may be formed together with the bonding pads BP2 and the metal electrode 70 when the bonding pads BP2 and the metal electrode 70 are formed, and may be formed of the same material as the bonding pads BP2 and the metal electrode 70.

The dummy electrodes DUMMY do not perform a function for electrical coupling. The dummy electrodes DUMMY may be disposed to achieve a uniform pattern density together with the bonding pads BP2 and the metal electrode 70, and thereby, may serve to suppress a stress concentration phenomenon and a resultant warpage due to the non-uniform disposition of the bonding pads BP2 and the metal electrode 70.

Figure 22:
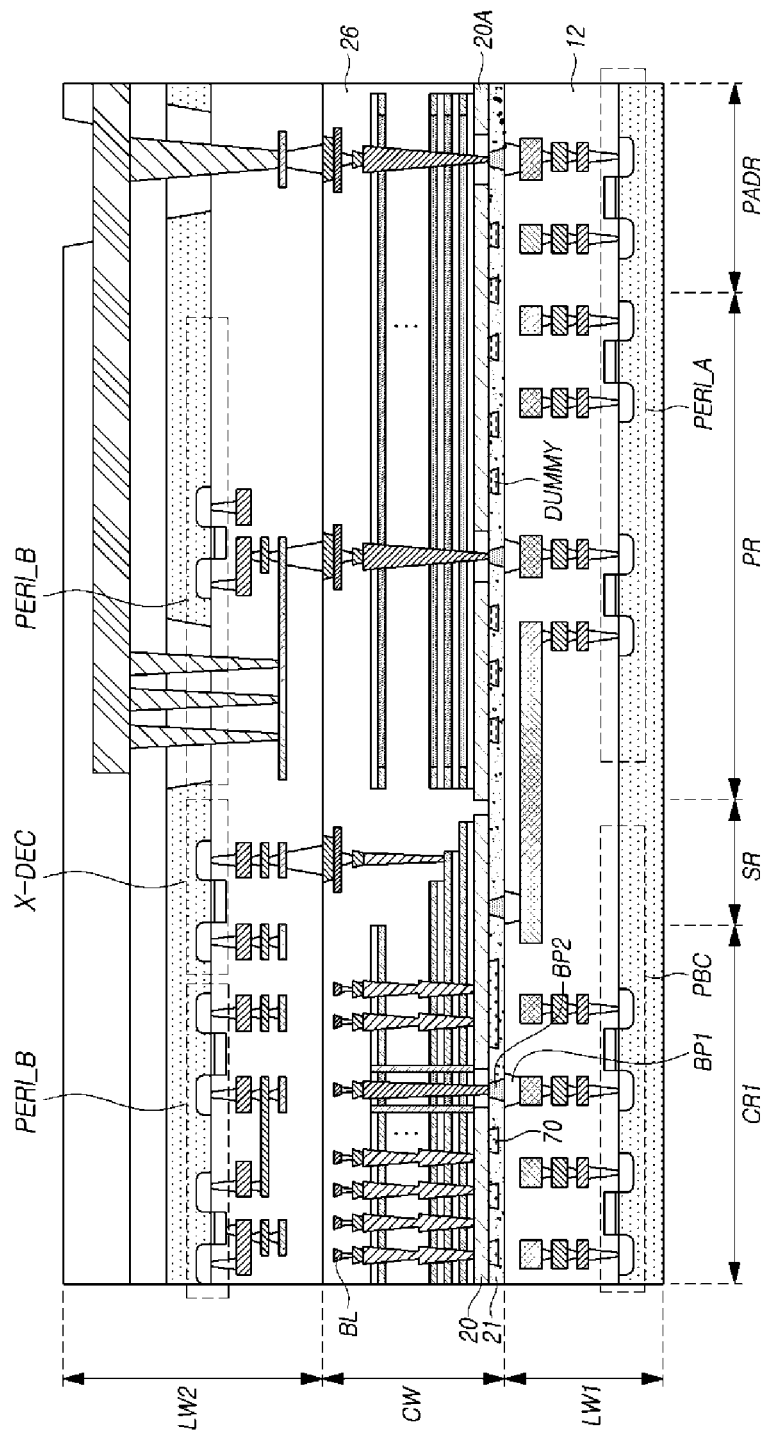

Referring to FIG. 22, the bonding pads BP2 may be exposed on the bottom surface of the base dielectric layer 21 to be bonded to the bonding pads BP1 of the first logic wafer LW1. The metal electrode 70 and the dummy electrodes DUMMY may have a thickness smaller than that of the bonding pads BP2, and may be covered by the base dielectric layer 21. The metal electrode 70 and the first logic wafer LW1 may be isolated from each other by the base dielectric layer 21, and the dummy electrodes DUMMY and the first logic wafer LW1 may also be isolated from each other. Accordingly, a failure in which the metal electrode 70 and the dummy electrodes DUMMY are short-circuited with a conductive structure defined on the top surface of the first logic wafer LW1 may be prevented.

Figure 23:
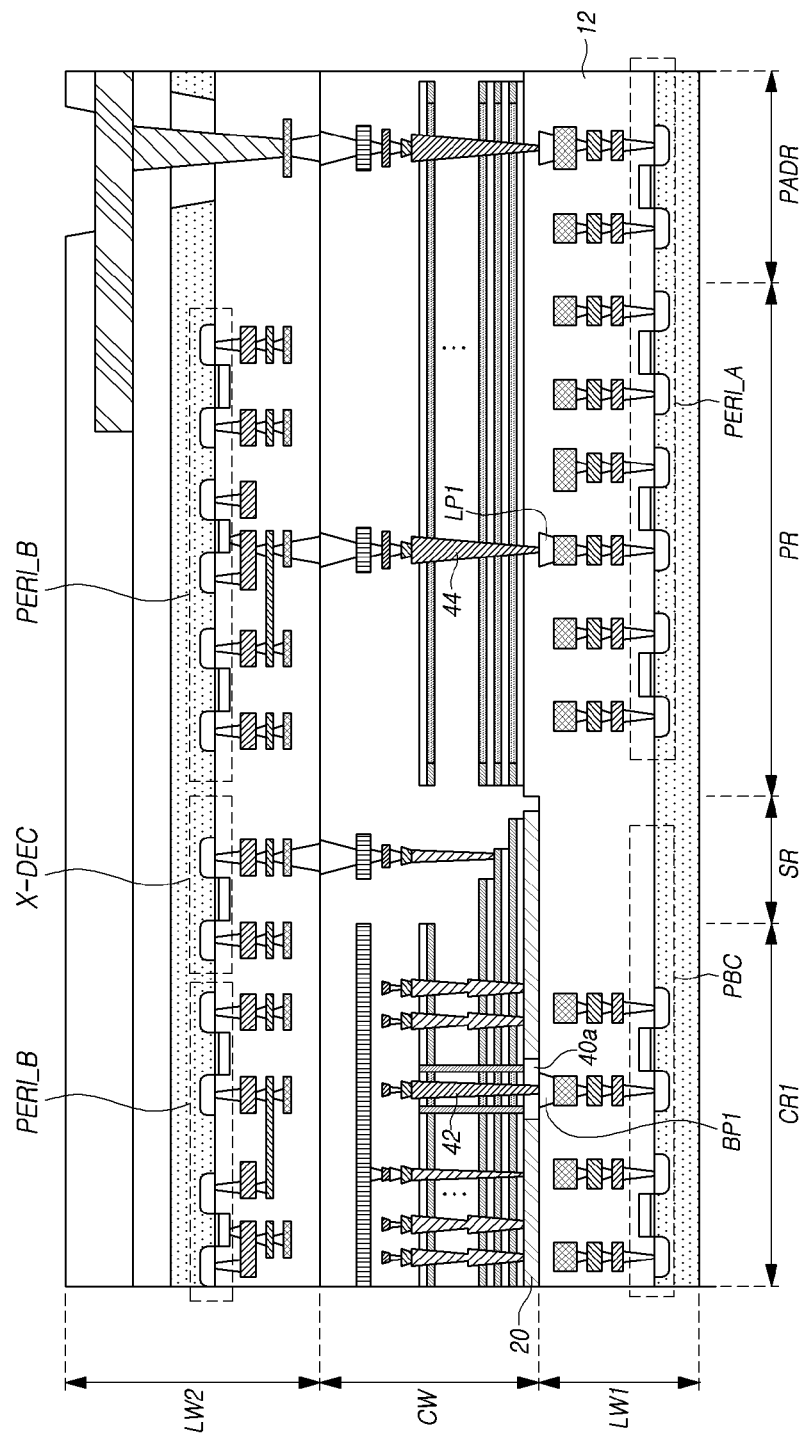

Referring to FIG. 23, the dummy source plate 20A (see FIG. 22) may be removed, and thereby, a recessed part may be defined on one surface of the cell wafer CW, which is bonded to the first logic wafer LW1.

The bottom surface of the dummy stack structure may be disposed on the same plane as the top surface of the source plate 20. The bottom surface of the dummy stack structure and the bottom surface of the source plate 20 may be bonded to the first logic wafer LW1.

The dielectric layer 12 of the first logic wafer LW1 may have, on the top surface thereof, a protruded part that is coupled to the recessed part on the one surface of the cell wafer CW. The first logic wafer LW1 may include a bonding pad BP1 that is disposed under the stack structure and a landing pad LP1 that is disposed under the dummy stack structure. The bonding pad BP1 and the landing pad LP1 may be disposed at the same height level. The bonding pad BP1 may be exposed on the top surface of the dielectric layer 12, and the landing pad LP1 may be covered by the dielectric layer 12.

The contact 42 may pass through the dielectric stack of the stack structure and the isolation dielectric layer 40a and be coupled to the bonding pad BP1. The contact 44, which passes through the dummy stack structure, may pass through the dielectric stack of the dummy stack structure and the dielectric layer 12 of the first logic wafer LW1, and be coupled to the landing pad LP1, which is defined in the dielectric layer 12. The contact 42 may not pass through the bonding surface between the cell wafer CW and the first logic wafer LW1, and the contact 44 may pass through the bonding surface between the cell wafer CW and the first logic wafer LW1.

Figure 24:
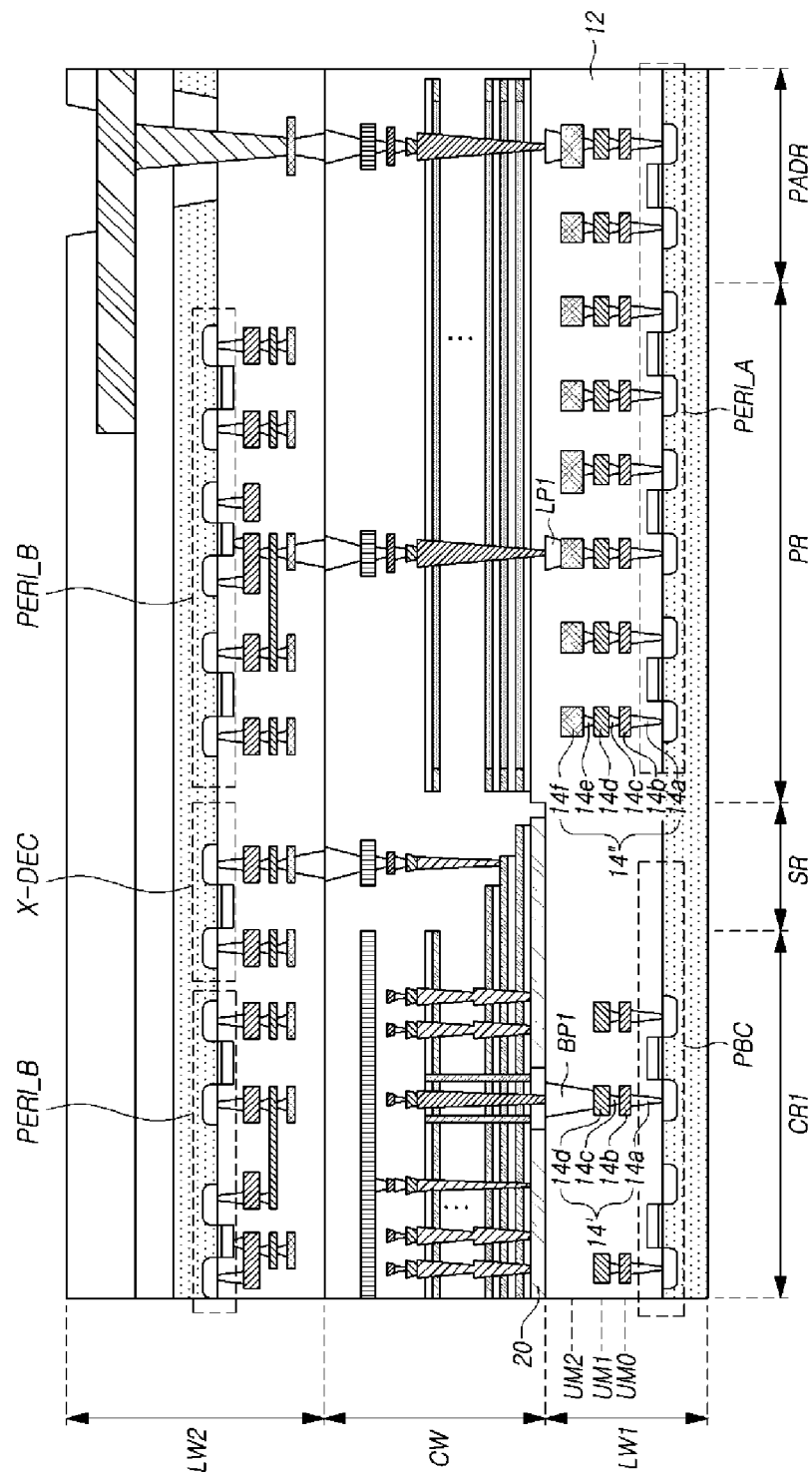

Referring to FIG. 24, the first logic wafer LW1 may include a first contact structure 14' and a second contact structure 14", which are defined in the dielectric layer 12.

The first contact structure 14' may be disposed in a region that overlaps with the source plate 20, and the second contact structure 14" may be disposed in a region that does not overlap with the source plate 20.

The first contact structure 14' may include a wiring line 14b, which is disposed in a first wiring layer UM0, and a wiring line 14d, which is disposed in a second wiring layer UM1 over the first wiring layer UM0. The second contact structure 14" may include a wiring line 14b, which is disposed in the first wiring layer UM0, a wiring line 14d, which is disposed in the second wiring layer UM1 over the first wiring layer UM0, and a wiring line 14f, which is disposed in a third wiring layer UM2 over the second wiring layer UM1. The uppermost wiring line 14d of the wiring lines 14b and 14d included in the first contact structure 14' may be disposed at a lower height level than the uppermost wiring line 14f of the wiring lines 14b, 14d and 14f included in the second contact structure 14".

Accordingly, as the vertical distance between the source plate 20 and the first contact structure 14' is longer than the vertical distance between the source plate 20 and the third wiring layer UM2, the coupling capacitance between the source plate 20 and the first contact structure 14' may be reduced.

The bonding pad BP1 may be defined on the uppermost wiring line 14d of the first contact structure 14'. The bonding pad BP1 may be exposed on one surface of the first logic wafer LW1, which is bonded to the cell wafer CW. The landing pad LP1 may be defined on the uppermost wiring line 14f of the second contact structure 14". The top surface of the bonding pad BP1 and the top surface of the landing pad LP1 may be disposed on the same plane, and the height of the bonding pad BP1 may be greater than the height of the landing pad LP1. The landing pad LP1 may not be exposed on the one surface of the first logic wafer LW1, which is bonded to the cell wafer CW.

Figure 25:
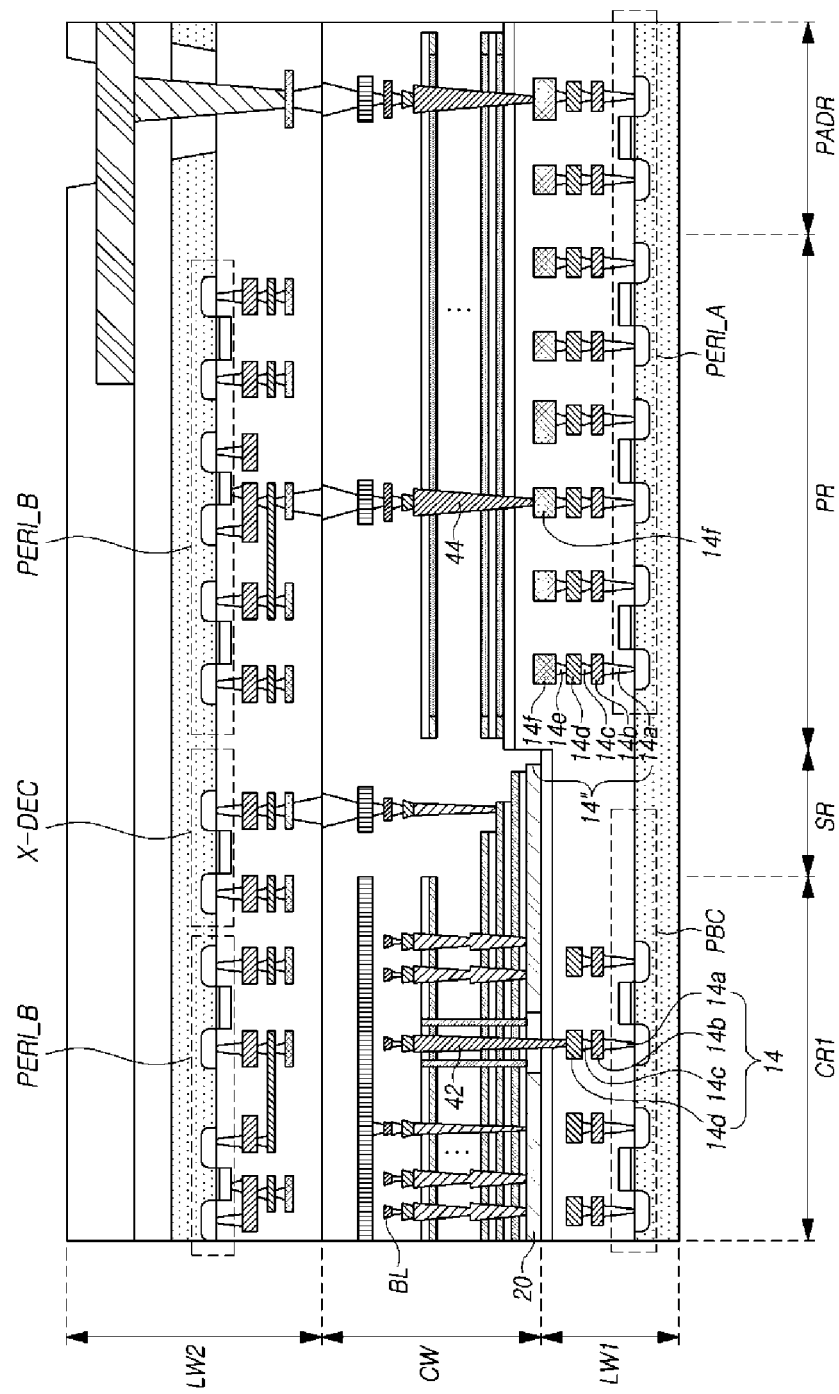

Referring to FIG. 25, the bonding pad BP1 and the landing pad LP1 of FIG. 24 may be removed. In a region overlapping with the source plate 20, the contact 42 may pass through the bonding surface between the cell wafer CW and the first logic wafer LW1, and may be directly coupled to the uppermost wiring line 14d of the first contact structure 14' of the first logic wafer LW1. In a region not overlapping with the source plate 20, the contact 44 may pass through the bonding surface between the cell wafer CW and the first logic wafer LW1, and may be directly coupled to the uppermost wiring line 14f of the second contact structure 14" of the first logic wafer LW1.

Because the uppermost wiring line 14d of the first contact structure 14' is positioned lower than the uppermost wiring line 14f of the second contact structure 14", the bottom end of the contact 42 may be disposed lower than the bottom end of the contact 44.

Figure 26:
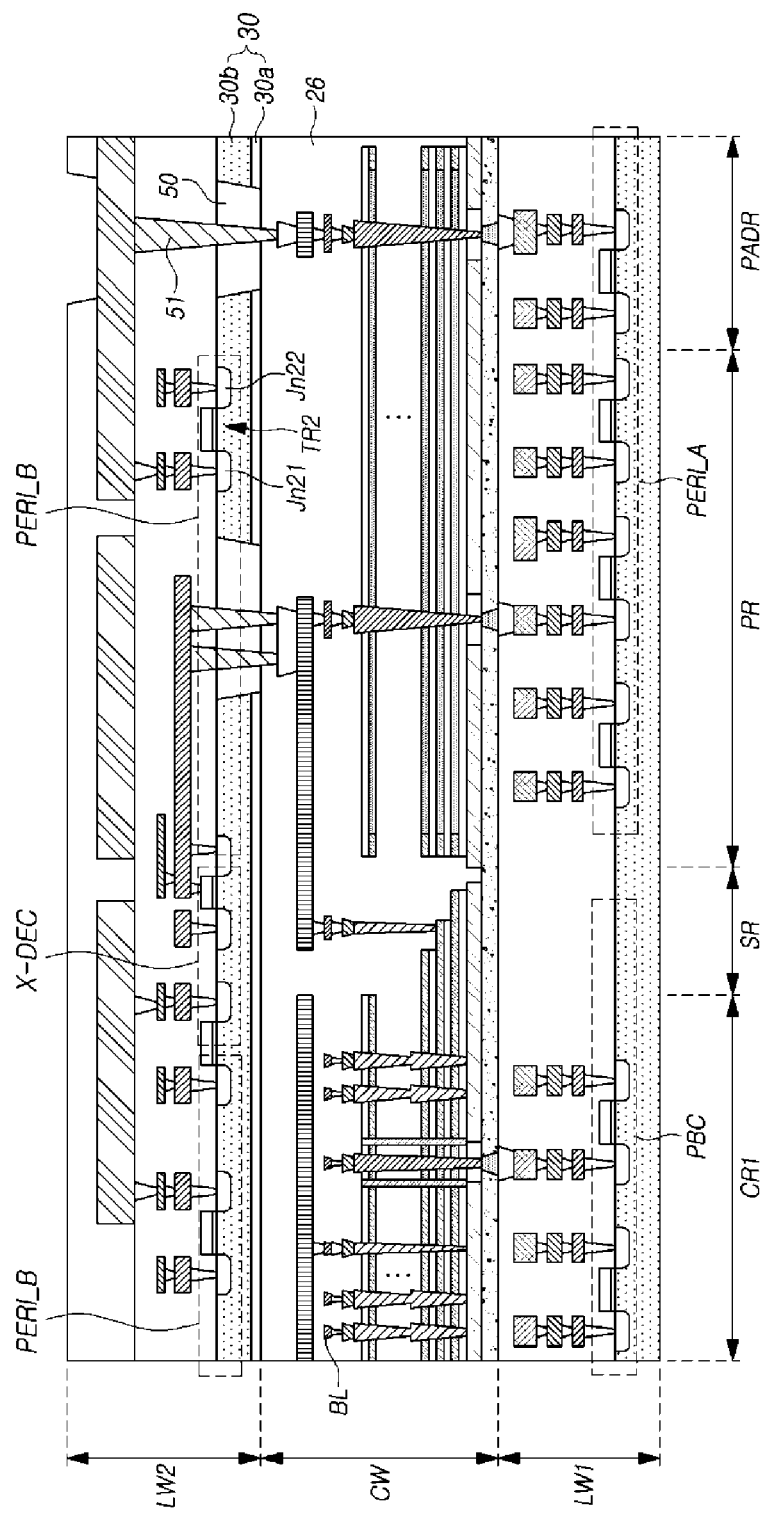

Referring to FIG. 26, a second substrate 30 of the second logic wafer LW2 may include a dielectric layer 30a and a semiconductor layer 30b which is stacked on the dielectric layer 30a. The dielectric layer 30a may include silicon oxide. The semiconductor layer 30b may include silicon or germanium. The second substrate 30 may be a silicon-on-insulator (SOI) substrate. The top surface of the semiconductor layer 30b may constitute the active surface of the second substrate 30, and the bottom surface of the dielectric layer 30a may constitute the back surface of the second substrate 30.

A plurality of second transistors TR2, which configure the row decoder X-DEC and the second peripheral circuit PERI_B, may be defined on the top surface of the semiconductor layer 30b. The dielectric layer 30a constituting the back surface of the second substrate 30 may be bonded onto the dielectric layer 26 of the cell wafer CW. The second logic wafer LW2 may be bonded onto the cell wafer CW in a face-up type such that the back surface of the second substrate 30 is brought into contact with the cell wafer CW.

The dielectric layer 30a of the second substrate 30 may limit a range in which ions implanted into junctions Jn21 and Jn22 of the second transistors TR2 are diffused, and may isolate the junctions Jn21 and Jn22 of the second transistors TR2 and the cell wafer CW. Therefore, as it is not necessary to form a thick semiconductor layer 30b of the second substrate 30 in consideration of the diffusion of the junctions Jn21 and Jn22 of the second transistors TR2, it is possible to contribute to reducing the thickness of the second substrate 30. Also, as it is not necessary to increase the thickness of the dielectric layer 26 of the cell wafer CW in order to insulate between the junctions Jn21 and Jn22 of the second transistors TR2 and the cell wafer CW, it is possible to contribute to reducing the thickness of the cell wafer CW.

An isolation dielectric layer 50, which passes through the second substrate 30 from the back surface of the second substrate 30, may be defined. The isolation dielectric layer 50 may be formed of an oxide. Plugs 51 may pass through the isolation dielectric layer 50, which may serve to insulate the plugs 51 and the second substrate 30 from each other. The isolation dielectric layer 50 may be continuously formed in a region where the row decoder X-DEC and the second peripheral circuit PERI_B are not disposed. If the isolation dielectric layer 50 is locally formed only around the individual plug 51, then the coupling between the semiconductor layer 30b and the plug 51 becomes excessively large, and thus, the electrical characteristics of the memory device may be degraded. The isolation dielectric layer 50 may be continuously disposed in the region where the row decoder X-DEC and the second peripheral circuit PERI_B are not disposed, and the plugs 51 may pass through the isolation dielectric layer 50 in a state in which they are spaced apart from the second substrate 30 by at least a predetermined distance. Accordingly, it is possible to secure the thickness of the isolation dielectric layer 50 between the semiconductor layer 30b and the plugs 51, and the coupling capacitance between the semiconductor layer 30b and the plugs 51 may be reduced.

The embodiments described above with reference to FIGS. 11 to 26 illustrate the page buffer circuit PBC and the first peripheral circuit PERI_A disposed in the first logic wafer LW1, and the row decoder X-DEC and the second peripheral circuit PERI_B disposed in the second logic wafer LW2, but different arrangements are also possible.

The embodiments described above with reference to FIGS. 4 to 26 illustrate the logic circuit divided into the page buffer circuit PBC and the first peripheral circuit PERI_A; and the row decoder X-DEC and the second peripheral circuit PERI_B disposed in different wafers, but the technical spirit of the disclosure is not limited thereto. The disclosure may include all cases in which a logic circuit is divided into a first logic wafer and a second logic wafer, and the first logic wafer and the second logic wafer are bonded to the top and the bottom of a cell wafer in which a memory cell array is defined, in such a manner that two or more of circuits configuring the logic circuit overlap with the memory cell array in a vertical direction.

As is apparent from the above description, according to the embodiments of the disclosure, a logic circuit may be configured in a first logic wafer and a second logic wafer, and the first logic wafer and the second logic wafer may be bonded to the top and the bottom of a cell wafer, in which a memory cell array is defined, in such a manner that two or more of circuits configuring the logic circuit overlap with the memory cell array in a vertical direction. Therefore, it is possible to contribute to improving layout utilization efficiency and reducing the size of a memory device.

According to the embodiments of the disclosure, the memory cell array is fabricated on a separate wafer from the logic circuit. Therefore, when compared to a case where the memory cell array is fabricated on the same wafer as the logic circuit, it is possible to reduce the number of process steps and shorten a fabrication time required for fabricating a cell wafer, thereby contributing to improving productivity.

Figure 27:
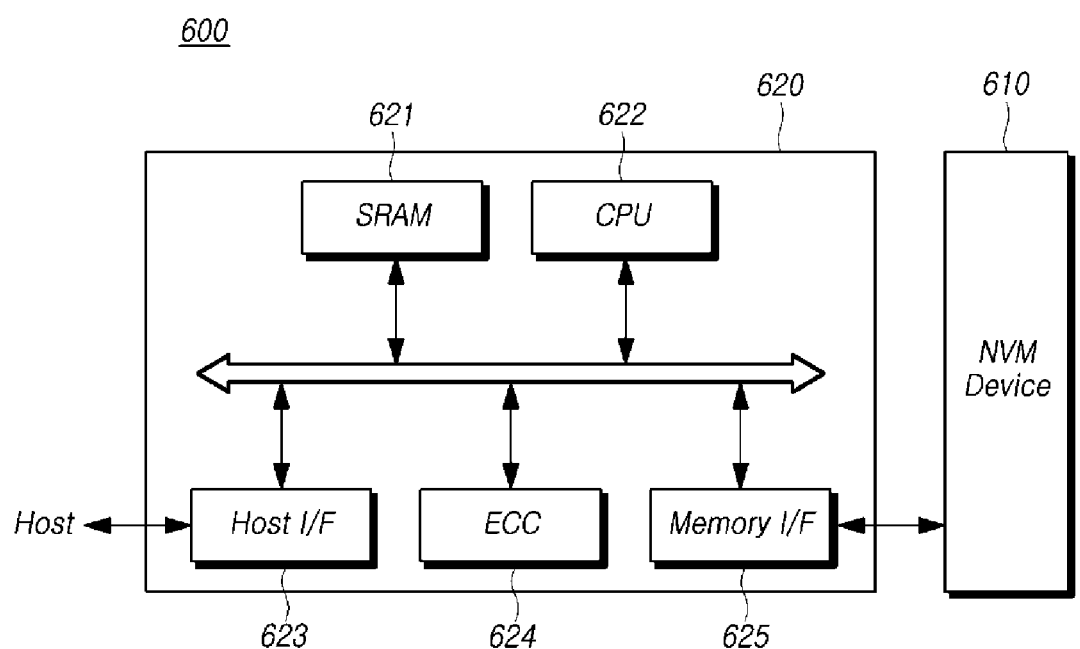
FIG. 27 is a block diagram schematically illustrating a representation of a memory system including a memory device in accordance with an embodiment of the disclosure.

FIG. 27 is a block diagram schematically illustrating a representation of a memory system including a memory device in accordance with an embodiment of the disclosure.

Referring to FIG. 27, a memory system 600 in accordance with an embodiment may include a nonvolatile memory device 610 and a memory controller 620.

The nonvolatile memory device 610 may be constituted by a memory device described above and may operate in the manner described above. The memory controller 620 may be configured to control the nonvolatile memory device (NVM Device) 610. The combination of the nonvolatile memory device (NVM Device) 610 and the memory controller 620 may be provided as a memory card or a solid state disk (SSD). An SRAM 621 is used as a working memory of a processing unit (CPU) 622. A host interface (Host I/F) 623 includes a data exchange protocol of a host which is coupled with the memory system 600.

An error correction code block (ECC) 624 detects and corrects an error included in data read from the nonvolatile memory device (NVM Device) 610.

A memory interface (Memory I/F) 625 interfaces with the nonvolatile memory device (NVM Device) 610 of the present embodiment. The processing unit 622 performs general control operations for data exchange of the memory controller 620.

Although not shown in the drawing, it is obvious to a person skilled in the art to which the embodiment pertains that the memory system 600 in accordance with the embodiment may be additionally provided with a ROM which stores code data for interfacing with the host. The nonvolatile memory device (NVM Device) 610 may be provided as a multi-chip package which is constituted by a plurality of flash memory chips.

The memory system 600 in accordance with the embodiment, described above, may be provided as a storage medium of high reliability, which has a low probability of an error to occur. In particular, the nonvolatile memory device of the present embodiment may be included in a memory system such as a solid state disk (SSD) which is being actively studied recently. In this case, the memory controller 620 may be configured to communicate with an exterior (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (Integrated Drive Electronics) protocol.

Figure 28:
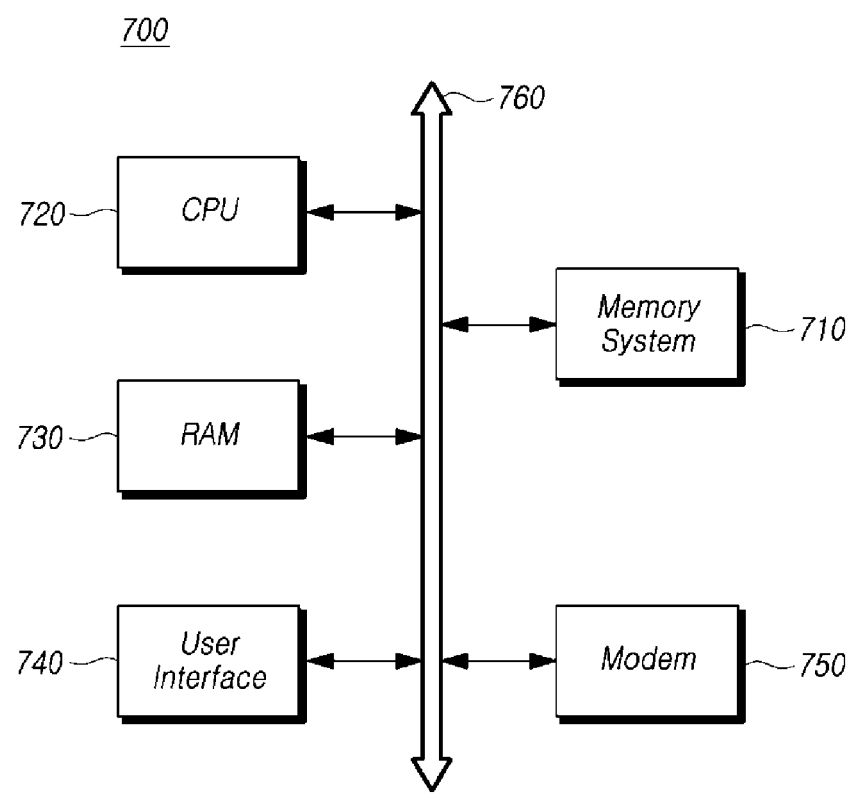
FIG. 28 is a block diagram schematically illustrating a representation of a computing system including a memory device in accordance with an embodiment of the disclosure.

FIG. 28 is a block diagram schematically illustrating a representation of a computing system including a memory device in accordance with an embodiment of the disclosure.

Referring to FIG. 28, a computing system 700 in accordance with an embodiment may include a memory system 710, a microprocessor (CPU) 720, a RAM 730, a user interface 740 and a modem 750 such as a baseband chipset, which are electrically coupled to a system bus 760. In the case where the computing system 700 in accordance with the embodiment is a mobile device, a battery (not shown) for supplying the operating voltage of the computing system 700 may be additionally provided. Although not shown in the drawing, it is obvious to a person skilled in the art to which the embodiment pertains that the computing system 700 in accordance with the embodiment may be additionally provided with an application chipset, a camera image processor (CIS), a mobile DRAM, and so on. The memory system 710 may configure, for example, an SSD (solid state drive/disk) which uses a nonvolatile memory to store data. Otherwise, the memory system 710 may be provided as a fusion flash memory (for example, an OneNAND flash memory).

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure may be interpreted in connection with the appended claims and encompass all equivalents falling within the scope of the appended claims.

What is claimed is:

1. A memory device comprising:
a cell wafer including a memory cell array;
a first logic wafer bonded to a bottom of the cell wafer, and including a first logic circuit; and
a second logic wafer bonded to a top of the cell wafer, and including a second logic circuit,
the memory cell array comprising:
a source plate; and
a stack structure including a plurality of electrode layers and a plurality of interlayer dielectric layers that are alternately stacked on the source plate.

2. The memory device according to claim 1,
wherein the stack structure further includes a dielectric stack including a plurality of dielectric layers and the plurality of interlayer dielectric layers that are alternately stacked, and
wherein the memory cell array is coupled to the first logic circuit through a contact that passes through the dielectric stack.

3. The memory device according to claim 2,
wherein the first logic circuit comprises a column control circuit,
wherein the memory cell array further comprises a bit line, which is disposed over the dielectric stack, and
wherein the contact couples the bit line and the column control circuit.

4. The memory device according to claim 3, wherein the column control circuit is disposed in a cell region, and the dielectric stack is disposed in the cell region to overlap with the column control circuit.

5. The memory device according to claim 3,
wherein the cell wafer further includes a source electrode, which is disposed in a wiring layer over the bit line, and
wherein the source electrode is disposed in the cell region, and is coupled to the source plate through a contact structure, which passes through the stack structure.

6. The memory device according to claim 5, wherein the source electrode has a flat plate shape corresponding to the cell region.

7. The memory device according to claim 2,
wherein the first logic circuit comprises a row control circuit, and
wherein the contact couples one of the plurality of electrode layers and the row control circuit.

8. The memory device according to claim 7,
wherein the row control circuit is disposed in a slimming region and an edge portion of the cell region, which is adjacent to the slimming region, and
wherein the dielectric stack is disposed to overlap with the row control circuit.

9. The memory device according to claim 2,
wherein the first logic wafer further includes a first bonding pad, which is coupled to the first logic circuit, on one surface thereof, which is bonded to the cell wafer,
wherein the cell wafer further includes a base dielectric layer, which supports the source plate and is bonded to the first logic wafer, a second bonding pad, which is bonded to the first bonding pad, and an isolation dielectric layer, which passes through the source plate under the dielectric stack, and
wherein the contact passes through the isolation dielectric layer, and the second bonding pad is coupled to the contact by passing through the base dielectric layer.

10. The memory device according to claim 2,
wherein the first logic wafer further includes a bonding pad, which is coupled to the first logic circuit, on one surface thereof, which is bonded to the cell wafer,
wherein the cell wafer further includes a base dielectric layer, which supports the source plate and is bonded to the first logic wafer, an isolation dielectric layer, which passes through the source plate under the dielectric stack, and a conductive contact plug, which is coupled to the bonding pad by passing through the isolation dielectric layer and the base dielectric layer, and
wherein a bottom end of the contact is coupled to the conductive contact plug.

11. The memory device according to claim 2,
wherein the first logic wafer further includes a first bonding pad, which is coupled to the first logic circuit, on one surface thereof, which is bonded to the cell wafer,
wherein the cell wafer further includes a base dielectric layer, which supports the source plate and is bonded to the first logic wafer, an isolation dielectric layer, which passes through the source plate under the dielectric stack, a conductive contact plug, which passes through the isolation dielectric layer, and a second bonding pad, which is bonded to the first bonding pad, and
wherein a bottom end of the contact is coupled to the conductive contact plug, and the second bonding pad is coupled to the conductive contact plug by passing through the base dielectric layer.

12. The memory device according to claim 2,
wherein the first logic wafer further includes a bonding pad, which is coupled to the first logic circuit, on one surface thereof, which is bonded to the cell wafer,
wherein the cell wafer further includes a base dielectric layer, which supports the source plate and is bonded to the first logic wafer, an isolation dielectric layer, which passes through the source plate, and a bonding contact, which is bonded to the bonding pad, and
wherein the contact is coupled to the bonding contact by passing through an upper part of the dielectric stack, and the bonding contact passes through a lower part of the dielectric stack, the isolation dielectric layer and the base dielectric layer.

13. The memory device according to claim 12,
wherein the plurality of electrode layers comprise at least one source select line, which is stacked on the source plate, a plurality of word lines, which are stacked on the source select line, and at least one drain select line, which is stacked on the plurality of word lines, and
wherein a top end of the bonding contact projects upward out of a top surface of the source select line.

14. The memory device according to claim 2,
wherein the first logic wafer further includes a bonding pad, which is coupled to the first logic circuit, on one surface thereof, which is bonded to the cell wafer,
wherein the cell wafer further includes a base dielectric layer, which is bonded to the first logic wafer and supports the source plate, and an isolation dielectric layer, which passes through the source plate under the dielectric stack, and
wherein the contact is coupled to the bonding pad by passing through the isolation dielectric layer and the base dielectric layer.

15. The memory device according to claim 2,
wherein the first logic wafer further includes a first substrate in which the first logic circuit is defined, a first dielectric layer, which is defined on the first substrate to cover the first logic circuit, and a contact structure, which is disposed in the first dielectric layer and is coupled to the first logic circuit, and
wherein the contact is coupled to the contact structure by passing through a bonding surface between the cell wafer and the first logic wafer.

16. The memory device according to claim 3,
wherein the first logic wafer further includes a first bonding pad, which is coupled to the first logic circuit, on one surface thereof, which is bonded to the cell wafer,
wherein the cell wafer further includes a base dielectric layer, which is bonded to the first logic wafer and supports the source plate, an isolation dielectric layer, which passes through the source plate under the dielectric stack, a wiring line, which is disposed between the stack structure and a bit line, and a second bonding pad, which is bonded to the first bonding pad, and
wherein the contact is coupled to the wiring line by passing through the dielectric stack, and the second bonding pad is coupled to the contact by passing through the base dielectric layer and the isolation dielectric layer.

17. The memory device according to claim 2,
wherein the first logic wafer further includes a bonding pad, which is coupled to the first logic circuit, on one surface thereof, which is bonded to the cell wafer,
wherein the cell wafer further includes a base dielectric layer, which supports the source plate and is bonded to the first logic wafer, an isolation dielectric layer, which passes through the source plate under the dielectric stack, and a bonding contact, which is bonded to the bonding pad,
wherein the contact passes through an upper part of the dielectric stack, and
wherein the bonding contact is coupled to the contact by passing through the base dielectric layer, the isolation dielectric layer and a lower part of the dielectric stack.

18. The memory device according to claim 3,
wherein the first logic wafer further includes a source transistor, and a first bonding pad, which is disposed on one surface of the first logic wafer bonded to the cell wafer, and is coupled to the source transistor, and
wherein the cell wafer further includes a second bonding pad, which is coupled to the source plate and is bonded to the first bonding pad.

19. The memory device according to claim 18,
wherein the cell wafer further includes a third bonding pad, which is disposed at a same height level as a bit line, and
wherein one surface of the cell wafer, which is bonded to the second logic wafer is disposed on a same plane as top surfaces of the bit line and the third bonding pad.

20. The memory device according to claim 18,
wherein the cell wafer further includes a third bonding pad, which is positioned at a same height level as a bit line,
wherein the bit line is disposed in a cell region, and the third bonding pad is disposed outside the cell region, and
wherein one surface of the cell wafer, which is bonded to the second logic wafer is disposed at a higher height level than top surfaces of the bit line and the third bonding pad in the cell region, and is disposed on a same plane as the top surfaces of the bit line and the third bonding pad outside the cell region.

21. The memory device according to claim 18,
wherein the cell wafer further includes a third bonding pad, which is disposed in a wiring layer between the stack structure and a bit line,
wherein the bit line is disposed in a cell region, and the third bonding pad is disposed outside the cell region, and
wherein one surface of the cell wafer, which is bonded to the second logic wafer is disposed at a higher height level than a top surface of the bit line in the cell region, and is disposed on a same plane as the top surface of the bit line outside the cell region.

22. The memory device according to claim 18, further comprising:
a metal electrode disposed on a bottom surface of the source plate, and coupled to the source plate.

23. The memory device according to claim 22,
wherein the cell wafer further includes a base dielectric layer, which supports the source plate and is bonded to the first logic wafer, and
wherein the metal electrode is isolated from the first logic wafer by the base dielectric layer.

24. The memory device according to claim 22, wherein the cell wafer further includes a dummy source plate, which is disposed at a same height level as the source plate, a dummy stack structure, which is disposed on a top surface of the dummy source plate, and a dummy electrode, which is disposed on a bottom surface of the dummy source plate.

25. The memory device according to claim 24,
wherein the cell wafer further includes a base dielectric layer, which supports the source plate and is bonded to the first logic wafer, and
wherein the metal electrode and the dummy electrode are isolated from the first logic wafer by the base dielectric layer.

26. The memory device according to claim 1,
wherein the cell wafer further includes a dummy stack structure,
wherein a bottom surface of the dummy stack structure is disposed on a same plane as a top surface of the source plate, and
wherein a bottom surface of the source plate and the bottom surface of the dummy stack structure are bonded to the first logic wafer.

27. The memory device according to claim 26,
wherein the first logic wafer further includes a first substrate in which the first logic circuit is defined, a first dielectric layer, which is defined on the first substrate to cover the first logic circuit, a first contact structure, which is disposed in the first dielectric layer and overlaps with the source plate in an extending direction of a vertical channel, and a second contact structure, which is disposed in the first dielectric layer and does not overlap with the source plate in the extending direction of the vertical channel,
wherein each of the first contact structure and the second contact structure includes a plurality of wiring lines, which are disposed at different height levels from a top surface of the first substrate, and wherein an uppermost wiring line of wiring lines included in the first contact structure is disposed at a lower height level than an uppermost wiring line of wiring lines included in the second contact structure.

* * * * *